(12) United States Patent
Kim

(10) Patent No.: US 10,608,153 B2
(45) Date of Patent: Mar. 31, 2020

(54) LIGHT EMITTING DEVICE PACKAGE AND LIGHT EMITTING APPARATUS HAVING THE SAME

(71) Applicant: LG INNOTEK CO., LTD., Seoul (KR)

(72) Inventor: Sung Ho Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 68 days.

(21) Appl. No.: 15/413,549

(22) Filed: Jan. 24, 2017

(65) Prior Publication Data

US 2017/0222109 A1 Aug. 3, 2017

(30) Foreign Application Priority Data

Jan. 28, 2016 (KR) .................. 10-2016-0010530

(51) Int. Cl.
*H01L 33/62* (2010.01)
*H01L 33/48* (2010.01)
*H01L 25/13* (2006.01)
*H01L 33/64* (2010.01)

(52) U.S. Cl.
CPC .............. *H01L 33/62* (2013.01); *H01L 25/13* (2013.01); *H01L 33/486* (2013.01);
(Continued)

(58) Field of Classification Search
CPC ........... H01L 33/62; H01L 2224/32257; H01L 2224/3226; H01L 21/76264;
(Continued)

(56) References Cited

U.S. PATENT DOCUMENTS 7,652,306 B2 1/2010 Lee et al.
8,013,357 B2 9/2011 Park et al.
(Continued)

FOREIGN PATENT DOCUMENTS

EP 2 082 858 7/2009
EP 2 136 414 12/2009
(Continued)

OTHER PUBLICATIONS

European Search Report dated Mar. 9, 2017 issued in Application No. 17152960.5.

*Primary Examiner* — Latanya N Crawford
(74) *Attorney, Agent, or Firm* — Ked & Associates, LLP

(57) ABSTRACT

A light emitting device package is provided. The light emitting device package may include a body having first to sixth side surfaces and a cavity on the first side surface, first and second lead frames on a bottom of the cavity, and a light emitting chip on at least one of the first and second lead frames. The first and second lead frames may have first and second bonding portions on first and second outer side areas of the body and a first heat and second radiating portions bent from the first and second bonding portions. The first and second recesses may include an upper area inclined at a first angle and a lower areas inclined at a second angle from the upper area. The second angle may be smaller than the first angle, and the first and second heat radiating portions of the first and second lead frames may be provided on the lower areas.

20 Claims, 10 Drawing Sheets

(52) U.S. Cl.
CPC .. *H01L 33/642* (2013.01); *H01L 2224/48091* (2013.01); *H01L 2224/48247* (2013.01); *H01L 2224/48257* (2013.01)

(58) Field of Classification Search
CPC ..... H01L 21/76202; H01L 2027/11833; H01L 29/7835; H01L 29/513; H01L 33/486; H01L 25/13; H01L 2224/48257; H01L 2224/48247; H01L 33/642; H01L 2224/48091; H01L 33/64; H01L 33/60; H01L 33/58; H01L 33/48
See application file for complete search history.

(56) References Cited

U.S. PATENT DOCUMENTS

| | | | |
|---|---|---|---|
| 2006/0101757 | A1 | 5/2006 | Tsuzuki et al. |
| 2008/0298081 | A1 | 12/2008 | Oon et al. |
| 2009/0189175 | A1* | 7/2009 | Park ...................... H01L 33/486 257/99 |
| 2009/0189176 | A1 | 7/2009 | Kim et al. |
| 2010/0109042 | A1 | 5/2010 | Asakawa |
| 2010/0314658 | A1 | 12/2010 | Yamamoto |
| 2011/0175127 | A1* | 7/2011 | Kanada .................. H01L 33/60 257/98 |

FOREIGN PATENT DOCUMENTS

| | | |
|---|---|---|
| EP | 2 244 310 | 10/2010 |
| EP | 2 315 263 | 4/2011 |
| JP | 2002-280616 | 9/2002 |
| JP | 2010-141058 | 6/2010 |
| KR | 10-2009-0082004 | 7/2009 |
| KR | 10-2009-0082641 | 7/2009 |
| KR | 10-2010-0003556 | 1/2010 |

* cited by examiner

LIGHT EMITTING DEVICE PACKAGE AND LIGHT EMITTING APPARATUS HAVING THE SAME

CROSS-REFERENCE TO RELATED APPLICATION

This application claims priority under 35 U.S.C. § 119 to Korean Application No. 10-2016-0010530 filed on Jan. 28, 2016, whose entire disclosure is herein incorporated by reference.

BACKGROUND

1. Field

A light emitting device package and light emitting apparatus having the same are provided.

2. Background

A light emitting device may include, for example, a light emitting diode (LED), which is a type of semiconductor device that converts electrical energy into light and has been spotlighted as a next generation light source in place of fluorescent lamps and incandescent lamps. Since the light emitting diode generates light by using a semiconductor device, it consumes very low power compared with incandescent lamps generating light by heating tungsten or fluorescent lamps producing light by colliding ultraviolet light generated through high pressure discharge to phosphors. Also, since the light emitting diode generates light by using energy potential gaps of semiconductor devices, it has a longer lifetime, faster response characteristics and eco-friendly characteristic as compared with other light sources.

Accordingly, much research has been conducted to replace conventional light sources with light emitting diodes. The light emitting diode has been increasingly used as a light source of light apparatuses, such as, e.g., various lamps used indoors and outdoors, liquid crystal display equipment, electric signboards, and streetlights.

BRIEF DESCRIPTION OF THE DRAWINGS

The embodiments will be described in detail with reference to the following drawings in which like reference numerals refer to like elements, and wherein.

DETAILED DESCRIPTION

Figure 1:
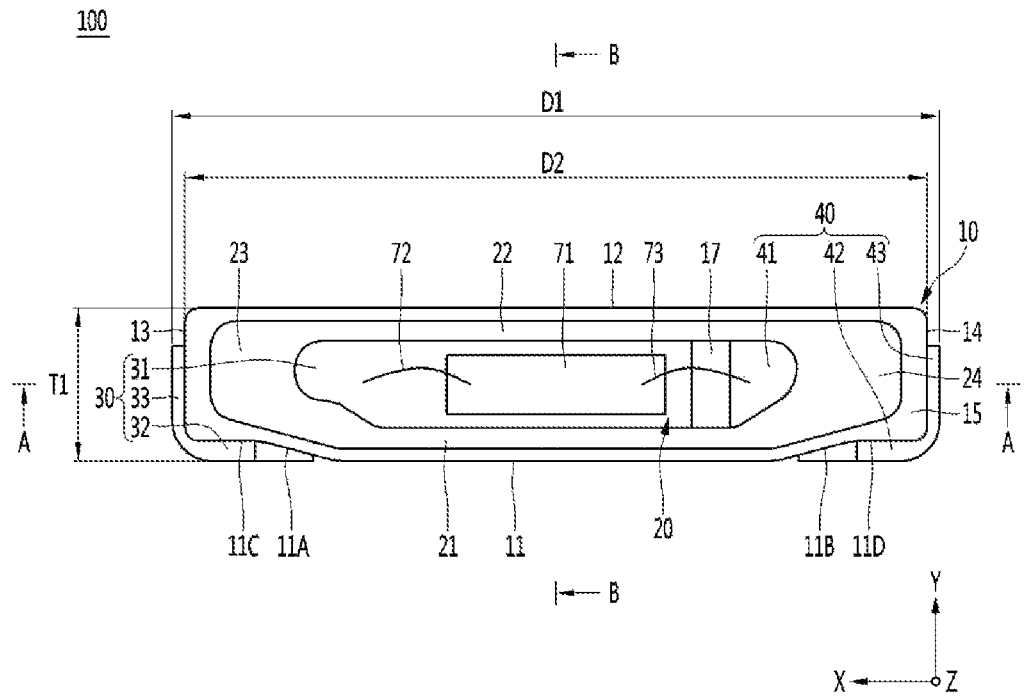
FIG. 1 is a plan view of a light emitting device package according to an embodiment.

Referring to FIGS. 1 to 11, a light emitting device package 100 may include a body 10 having a cavity 20, a plurality of lead frames 30 and 40 in the cavity 20, and a light emitting chip 71 provided on at least one of the plurality of lead frames 30 and 40. The light emitting device package 100 may be implemented as a side view or a side surface light emitting type package, and may be applied to a liquid crystal display apparatus, such as, e.g., a mobile phone and a portable computer, various illumination fields, and a pointing apparatus.

Figure 2:
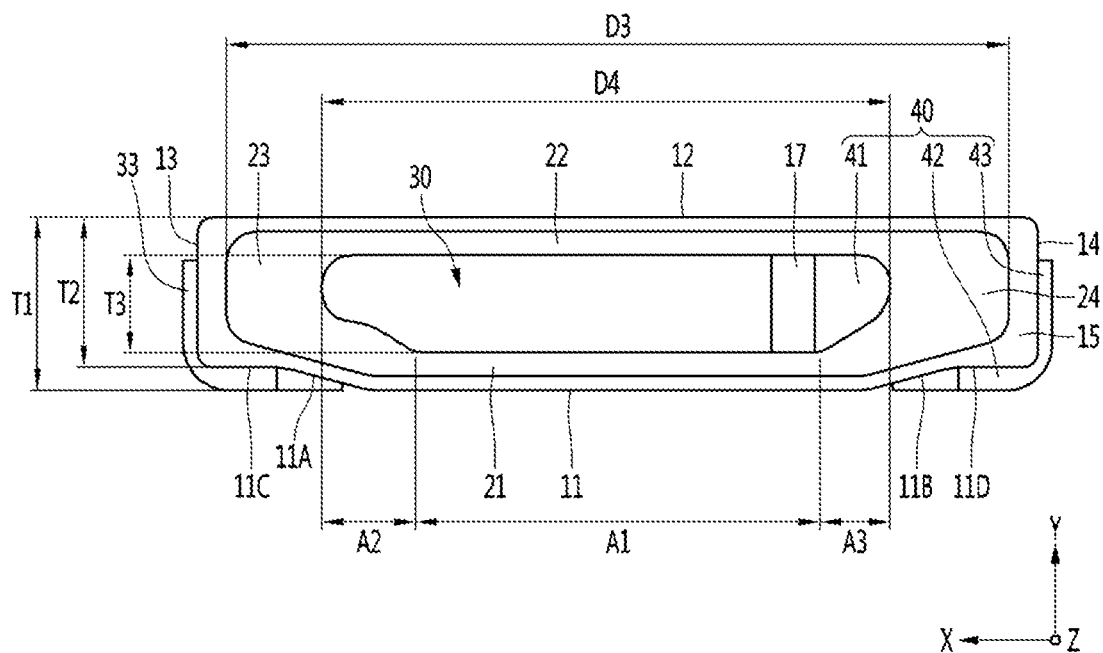
FIG. 2 is an enlarged plan view of FIG. 1.

Referring to FIGS. 1 and 2, a first axis direction in the light emitting device package 100 may be an X axis direction or a transverse direction, and a second axis direction may be a Y axis direction or a height or thickness direction, and a third axis direction may be a Z axis direction or a longitudinal direction. The first and second axis directions may be orthogonal directions to each other, and the third axis direction may be orthogonal to the first and second axis directions. The direction of each of X, Y, and Z axes of the light emitting device package 100 may be applied to the body 10 or the lead frames 30 and 40.

The light emitting device package 100 may be provided as a side view package so that the cavity 20 may have a length in a first axis X direction larger than a height in a second axis Y direction. In the light emitting device package 100, a length D1 in the first axis X direction may be three times or more than four times than a thickness T1 in the second axis Y direction. The length D1 in the first axis X direction may range from 2.5 mm or more, for example, 2.7 mm to 4.5 mm.

As the length D1 in the first axis X direction of the light emitting device package 100 is provided longer, when the light emitting device packages 100 are arranged on a circuit board in the first axis X direction, the number of the light emitting device packages 100 arranged on the circuit board may be reduced. The thickness T1 of the light emitting device package 100 may be provided less than the length D1 and a height H1 of FIG. 3, and thus the thickness of a light unit having the light emitting device package 100 may be reduced. The thickness T1 of the light emitting device package 100 may be less than or equal to 1 mm.

The length D1 in the first axis X direction of the light emitting device package 100 may be greater than a length D2 of the body 10, and the thickness T1 may be equal to a thickness of the body 10, for example, the thickness in the second axis Y direction of the body 10. The length D2 of the body 10 may be three times or more than the thickness of the body 10.

The body 10 may include a first body part 10A having a cavity at a bottom thereof to which the lead frames 30 and 40 may be exposed, and a second body part 103 supporting the first body part 10A. The first body part 10A may be a upper portion body or a front portion body, and the second body part 10B may be a lower portion body or a rear portion body. The first body part 10A may be a front portion area based on the lead frames 30 and 40, and the second body part 10B may be a rear area based on the lead frames 30 and 40. The first body part 10A may be provided between a lower surface of the lead frames 30 and 40 exposed to the cavity 20 and a fifth side surface part or surface 15 of the body 10, and the second body part 10B may be provided between the lower surface of the lead frames 30 and 40 exposed to the cavity 20 and a sixth side surface part or surface 16 of the body 10. The first and second body parts 10A and 10B may be integrally formed. The plurality of lead frames 30 and 40, such as a first lead frame 30 and a second lead frame 40, may be coupled to the body 10.

The body 10 may be formed of an insulating material. The body 10 may be formed of a reflective material. The body 10 may be formed of a material having a reflectance higher than a transmittance with respect to a wavelength emitted from the light emitting chip 71, for example, a material having a reflectance of 70% or more. In the case in which the reflectance is 70% or more, the body 10 may be defined as a non-transparent material or a reflective material. The body 10 may be formed of a resin-based insulating material, for example, a resin material such as polyphthalamide (PPA). The body 10 may be formed of a thermosetting resin including a silicone-based, epoxy-based, or plastic material, or a material having high heat resistance and high light resistance. The body 10 may include a white-based resin. In the body 10, an acid anhydride, an antioxidant, a release agent, a light reflector, inorganic filler, a curing catalyst, a light stabilizer, a lubricant, and titanium dioxide may be selectively added.

The body 10 may be formed of at least one selected from the group consisting of an epoxy resin, a modified epoxy resin, a silicone resin, a modified silicone resin, an acrylic resin, and a urethane resin. For example, an epoxy resin composed of triglycidyl isocyanurate, hydrogenated bisphenol A diglycidyl ether, etc. and an acid anhydride composed of hexahydrophthalic anhydride, 3-methylhexahydrophthalic anhydride, 4-methylhexahydrophthalic anhydride, etc. are added with 1,8-diazabicyclo (5,4,0) undecene-7 (DBU) as a curing agent, ethylene glycol as a co-catalyst, titanium oxide pigment, and glass fiber in the epoxy resin, and thus, a solid epoxy resin composition which is partially cured by heating and B stated may be used but the present disclosure is not limited thereto. The body 10 may be formed by suitably mixing at least one selected from the group consisting of a dispersant, a pigment, a fluorescent material, a reflective material, a light shielding material, a light stabilizer, and a lubricant in a thermosetting resin.

The body 10 may include a reflective material, such as a resin material in which a metal oxide is added, and the metal oxide may include at least one of $TiO_2$, $SiO_2$, and $Al_2O_3$. Such a body 10 may effectively reflect incident light. As another example, the body 10 may be formed of a resin material having a translucent resin material or a phosphor material converting a wavelength of incident light.

Referring to FIGS. 1 and 2, side surfaces of the body 10 may include a first side surface part or surface 11 and a second side surface part or surface 12 opposite to the first side surface part 11, and third and fourth side surface parts or surfaces 13 and 14 adjacent to the first and second side surface parts 11 and 12 and provided opposite to each other. The first and second side surface parts 11 and 12 may be opposite to each other with respect to the second axis Y direction of the body 10, and the third and fourth side surface parts 13 and 14 may be opposite to each other with respect to the first axis X direction. The body 10 may include the fifth side surface part 15 and the sixth side surface part 16, and the fifth and sixth side surface parts 15 and 16 may be opposite to each other with respect to the third axis Z direction of the body 10.

The first side surface part 11 may be a bottom of the body 10, the second side surface part 12 may be an upper surface of the body 10, the first and second side surface parts 11 and 12 may be a long side surface having the length D2 of the body 10, and the third and fourth side surface parts 13 and 14 may be a short side surface having a thickness T2 smaller than the thickness T1 of the body 10. The first side surface part 11 may be a side surface corresponding to the circuit board.

Figure 3:
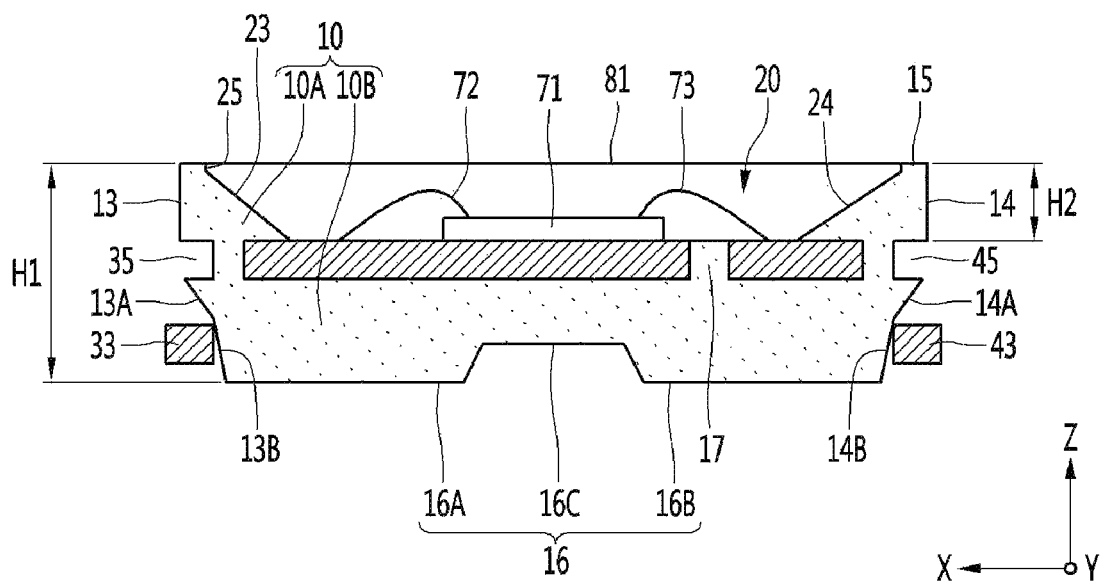
FIG. 3 is an A-A side cross-sectional view of the light emitting device package of FIG. 1.
Figure 4:
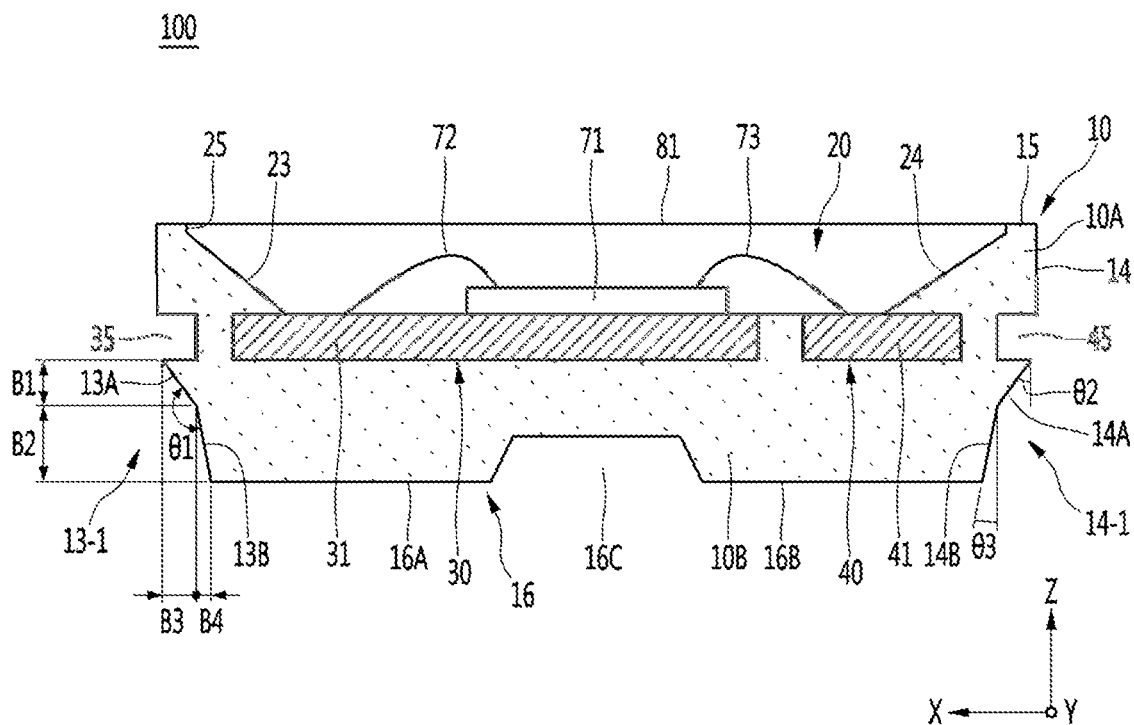
FIG. 4 is an enlarged side cross-sectional view of FIG. 3.

Like FIGS. 3 and 4, the body 10 may include the fifth side surface part 15 and the sixth side surface part 16, and the fifth side surface part 15 may be a surface in which the cavity 20 is provided, and may be a surface from which light is emitted. The fifth side surface part 15 may be a front surface part of the body 10. The sixth side surface part 16 may be the opposite side surface of the fifth side surface part 15. The sixth side surface part 16 may be a rear surface part of the body 10. The sixth side surface part 16 may include a first part 16A, a second part 16B, and a depression part 16C between the first part 16A and the second part 16B. The depression part 16C may be recessed between the first and second parts 16A and 16B in the cavity direction than the first and second parts 16A and 16B.

Figure 5:
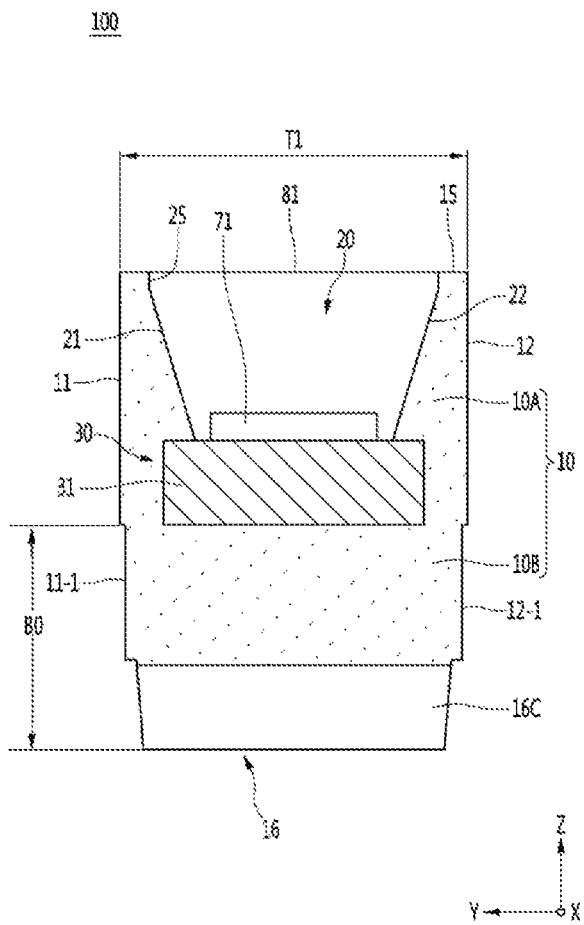
FIG. 5 is a B-B side cross-sectional view of the light emitting device package of FIG. 1.

Referring to FIG. 5, a first part area or first portion 11-1 of the first side surface part 11 of the body 10 is an area which is closer to the sixth side surface part 16 than the fifth side surface part 15, may be provided in a flat area, and may be provided parallel to the horizontal plane of the first side surface part 11. The first part area 11-1 may be a rear portion area provided in a rear direction further than the lower surface of the lead frames 30 and 40 among the area of the first side surface part 11. As the first side surface part 11 and the first part area 11-1 are provided as a flat surface, it is possible to prevent a problem that the fifth side surface part 15 of the body 10 is lifted by the first side surface part 11. The first part area 11-1 may be stepped at a height of 0.05 mm or less from the first side surface part 11, and may be provided in a plane.

A second part area or second portion 12-1 of the second side surface part 12 of the body 10 may be provided in a flat area, and the second part area 12-1 may be an area closer to the sixth side surface part 16 than the fifth side surface part 15, and may correspond to the first part area 11-1 of the first side surface part 11. The second part area 12-1 may be provided in parallel with the horizontal plane of the second side surface part 12. The second part area 12-1 may be a rear area provided in a rear direction further than the lower surface of the lead frames 30 and 40 among the area of the second side surface part 12. As the second side surface part 12 and the second part area 12-1 are provided as flat surfaces, it may be possible to prevent the other structures provided on the second side surface part 12 from being influenced horizontally.

The first part area 11-1 of the first side surface part 11 and the second part area 12-1 of the second side surface part 12 may be an area more adjacent to the sixth side surface part 16 than first and second lead parts or portions 31 and 41 of the first and second lead frames 30 and 40 among the area of the body 10. The first and second part areas 11-1 and 12-1 may be an area that does not overlap with the cavity 20 in the thickness direction of the body 10. The first and second part areas 11-1 and 12-1 may not be overlapped with the first and second lead parts 31 and 41 in the thickness direction of the body 10.

Figure 16:
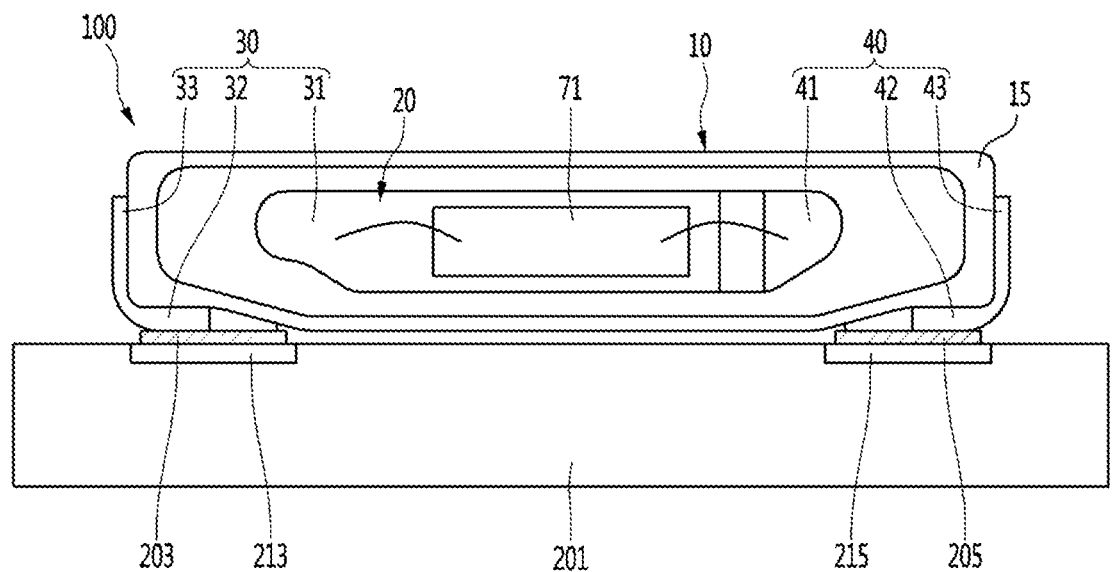
FIG. 16 is a side view of a light emitting apparatus having the light emitting device package according to an embodiment.
Figure 17:
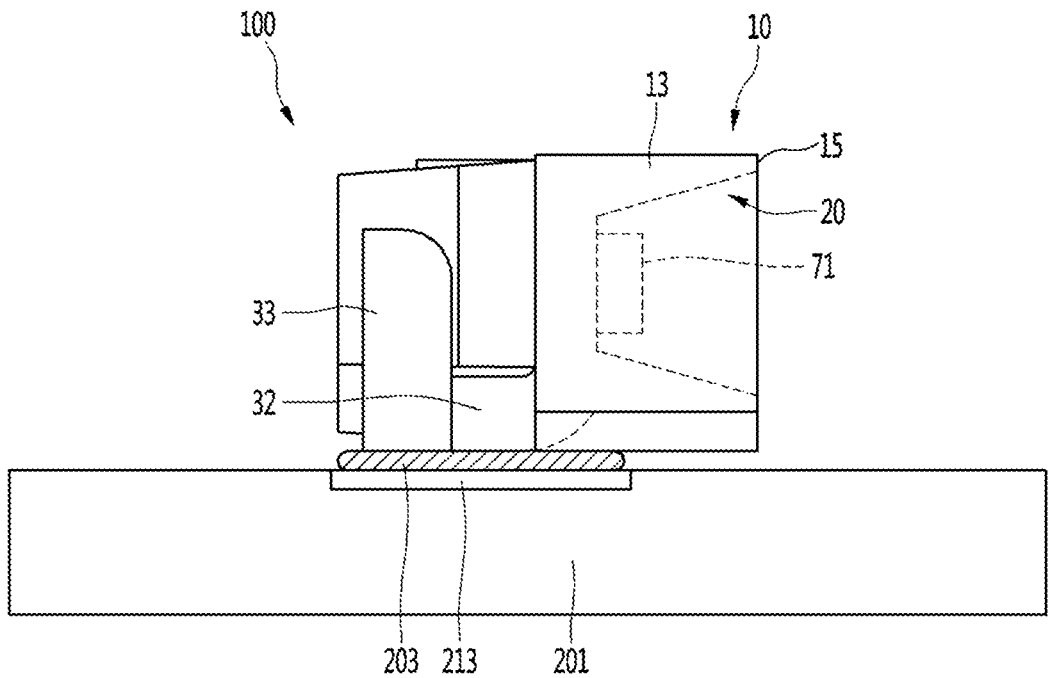
FIG. 17 is another side view of the light emitting apparatus of FIG. 15.

The embodiment may prevent lifting due to the height difference of the fifth and sixth side surface parts 15 and 16 in the bottom area of the body 10. A width B0 (B1+B2 in FIG. 4) of the first part area 11-1 of the first side surface part 11 and the second part area 12-1 of the second side surface part 12 may be a distance between the fifth and sixth side surface parts 15 and 16 of the body 10, for example, 50% or less of the width (H1 in FIG. 3) of the body 10, for example, a range of 45% to 50%. In the case in which the first part area 11-1 of the first side surface part 11 and the second part area 12-1 of the second side surface part 12 are smaller than the above range, it is difficult to secure the bonding area of first and second bonding parts or portions 32 and 42 of the first and second lead frames 30 and 40, and in the case of being larger than the above range, a problem in which the fifth side surface part 15 of the body 10 may be lifted may occur. The embodiment may prevent this problem in which a part of the emission side fifth side surface part 15 of the light emitting device package 100 provided on a circuit board 201 is lifted up, as shown in FIGS. 16 and 17.

The first lead frame 30 may include a first lead part or portion 31 provided at the bottom of the cavity 20, a first bonding part or portion 32 provided on a first outer side areas 11A and 11C of the first side surface part 11 of the body 10, and a first heat radiating part or portion 33 provided on the third side surface part 13 of the body 10. The first bonding part 32 is bent from the first lead part 31 provided in the body 10 and protrudes to the first outer side areas 11A and 11C of the first side surface part 11, and the first heat radiating part 33 may be bent in a direction of the third side surface part 13 from the first bonding part 32. The first outer side areas 11A and 11C of the first side surface part 11 may be an area adjacent to the third side surface part 13 of the body 10. The first outer side areas 11A and 11C of the first side surface part 11 may be provided between a center area of the first side surface part 11 and the third side surface part 13. The center area of the first side surface part 11 may be an area which has a constant distance between the first and second side surface parts 11 and 12, and the first outer side areas 11A and 11C may be an area in which the distance between the first and second side surface parts 11 and 12 is reduced or having a smaller distance than the thickness T1.

The second lead frame 40 may include a second lead part or portion 41 provided on the bottom of the cavity 20, a second bonding part or portion 42 provided on second outer side areas 11B and 11D of the first side surface part 11 of the body 10, and a second heat radiating part or portion 43 provided on the fourth side surface part 14 of the body 10. The second bonding part 42 may be bent from the second lead part 41 provided in the body 10 and may protrude to the second outer side areas 11B and 11D of the first side surface part 11. The second heat radiating part 43 may be bent from the second bonding part 42. The second outer side areas 11B and 11D of the first side surface part 11 may be an area adjacent to the fourth side surface part 14 of the body 10. Third outer side areas 11C and 11D of the first side surface part 11 may be provided between the center area of the first side surface part 11 and the third side surface part 13. The second outer side areas 11B and 11D may be an area in which the distance between the first and second side surface parts 11 and 12 is reduced or a distance smaller than the thickness T1.

The first outer side areas 11A and 11C and the second outer side areas 11B and 11D may have inclined areas 11A and 11B and flat areas 11C and 11D, and the first and second bonding parts 32 and 42 of the first and second lead frames 30 and 40 may protrude through the inclined areas 11A and 11B, but the present disclosure is not limited thereto. The inclined areas 11A and 11B may allow the first and second bonding parts 32 and 42 to protrude in an area in which the thickness of the body 10 is not too thin.

The first lead part 31 of the first lead frame 30 and the second lead part 41 of the second lead frame 40 may be provided on the bottom of the cavity 20. A separation part 17 may be provided on the bottom of the cavity 20 and may be provided between the first and second lead parts 31 and 41. The separation part 17 may be formed of a material of the body 10 and may be the same horizontal surface with the bottom of the cavity 20 or may protrude, but the present disclosure is not limited thereto.

The light emitting chip 71 may be provided on at least one of the first and second lead frames 30 and 40. The light emitting chip 71 may be provided on at least one of the first and second lead parts 31 and 41. The light emitting chip 71 may be provided on the first lead part 31 of the first lead frame 30, for example. The area of the first lead part 31 of the first lead frame 30 from the bottom of the cavity 20 may be larger than the area of the second lead part 41, and the light emitting chip 71 may be provided on the first lead part 31, and thus head generated through the light emitting chip 71 may be effectively radiated.

The light emitting chip 71 may be connected to the first and second lead parts 31 and 41 by wires 72 and 73. The light emitting chip 71 may be adhesively connected to the first lead part 31 and connected to the second lead part 41 by wires. The light emitting chip 71 may be a horizontal chip, a vertical chip, or a chip having a via-structure. The light emitting chip 71 may be mounted in a flip chip manner. The light emitting chip 71 may selectively emit light within a wavelength range of an ultraviolet ray to a visible ray. The light emitting chip 71 may emit ultraviolet light or a blue peak wavelength, for example. The light emitting chip 71 may include at least one of a group II-VI compound and a group III-V compound. The light emitting chip 71 may be formed of a compound selected from the group consisting of GaN, AlGaN, InGaN, AlInGaN, GaP, AlN, GaAs, AlGaAs, InP and mixtures thereof.

Like FIGS. 2, 3, and 5, in the inner side surface of the cavity 20, first, second, third and fourth inner side surfaces 21, 22, 23 and 24 provided around the cavity 20 may be inclined with respect to a horizontal straight line of the upper surface of the lead frames 30 and 40. A first inner side surface 21 adjacent to the first side surface part 11 and a second inner side surface 22 adjacent to the second side surface part 12 is inclined at an angle to the bottom of the cavity 20, and a third inner side surface 23 adjacent to the third side surface part 13 and a fourth inner side surface 24 adjacent to the fourth side surface part 14 may be inclined at an angle smaller than the inclination angle of the first and second inner side surfaces 21 and 22. Accordingly, the first and second inner side surfaces 21 and 22 reflect the progress of the incident light toward the second axis Y direction, and the third and fourth inner side surfaces 23 and 24 may diffuse the incident light in the first axis X direction.

The inner side surfaces 21, 22, 23 and 24 may have an area 25 vertically stepped from the fifth side surface part 15 of the body 10 like FIGS. 3 and 5. The stepped area 25 may be provided to be stepped between the fifth side surface part 15 of the body 10 and the inner side surfaces 21, 22, 23 and 24. The stepped area 25 may control the directivity characteristic of the light emitted through the cavity 20.

Referring to FIG. 2, when the bottom of the cavity 20 is viewed, a length D4 in the X axis direction is the minimum distance between the third and fourth inner side surfaces 23 and 24, and a width T3 in the Y axis direction may be the maximum distance between the first and second inner side surfaces 21 and 22. The first inner side surface 21 and the second inner side surface 22 may face each other in the cavity 20. The first inner side surface 21 may correspond to the first side surface part 11, the second inner side surface 22 may correspond to the second side surface part 12, a portion of the third inner side surface 23 may correspond to the third side surface part 13, and a portion of the fourth inner side surface 24 may correspond to the fourth side surface part 14.

The width T3 of a center area A1 of the cavity 20 in the Y axis direction may be wider than the width of first and second side areas A2 and A3. The center area A1 at the bottom of the cavity 20 may have a constant width T3 in the Y axis direction, and the size of the light emitting chip 71 may be increased. The first and second side areas A2 and A3 may be adjacent to the third and fourth side surface parts 13 and 14, and the width may be narrower in the region adjacent to the third and fourth side surface parts 13 and 14. The first and second side areas A2 and A3 may have a width narrower than the width T3 or gradually being narrowed, or may include an area having a curved line. The straight section of the center area A1 in the cavity 20 may be provided so that the second inner side surface 22 of the cavity 20 is longer than the first inner side surface 21, and this may prevent light progressing in the direction of the second inner side surface 22 and light progressing in the direction of the first inner side surface 21 may be guided in the side direction.

Like FIG. 3, a depth H2 of the cavity 20 may be a distance from the fifth side surface part 15 to the bottom of the cavity 20 and may not be more than ⅓ of the width H1 of the body 10, for example, may be in the range of 0.3 mm±0.05 mm. In the case in which the depth H2 of the cavity 20 is less than the above range, it may be difficult to control the directivity angle of light, and in the case of exceeding the above range, there may be a problem in that the width H1 of the body 10 is increased or the light directing angle is narrowed.

The width H1 of the body 10 may be a length in the Z-axis direction, and it may be a gap between the fifth side surface part 15 and the sixth side surface part 16 of the body 10. The width H1 of the body 10 may be greater than the thickness T1 of the body 10, and the difference between the width H1 of the body 10 and the thickness T1 may be 0.05 mm or more, for example, 0.05 mm to 0.5 mm, and in the case in which the thickness T1 of the body 10 is greater than the difference, the thickness of the light unit may be increased, and in the case of being smaller than the above range, the heat radiation area of the lead frames 30 and 40 may be reduced.

Like FIG. 2, when viewing the thickness of the body 10 in the Y-axis direction, the thickness T2 of the area adjacent to the third and fourth side surface parts 13 and 14 may be thinner than the thickness T1 of the center area of the body 10. The areas adjacent to the third and fourth side surface parts 13 and 14 of the first side surface part 11 of the body 10 may be recessed so that the first and second bonding parts 32 and 42 of the first and second lead frames 30 and 40 are positioned.

The third and fourth side surface parts 13 and 14 of the body 10 may have a depression parts or depressions 35 and 45 recessed inwardly, and fingers supporting the body 10 may be inserted into the depression parts 35 and 45 during the injection process of the body 10. The depression parts 35 and 45 may be recessed from opposite sides of the body 10 in the X axis direction toward a direction of the lead parts 31 and 41. The depression parts 35 and 45 may be provided on extension line extended parallel with the first and second lead parts 31 and 41 of the first and second lead frames 30 and 40. The depression parts 35 and 45 may be provided to be spaced apart from the first and second lead parts 31 and 41. A distance between the depression parts 35 and 45 and the first and second lead parts 31 and 41 may be equal to or less than the depth of the depression parts 35 and 45. The depth of the depression parts 35 and 45 may be formed in or at a depth through which a portion of the depression parts 35 and 45 may be overlapped with the cavity 20, for example, a portion of the cavity 20 in a vertical direction, but it is not limited thereto.

Figure 6:
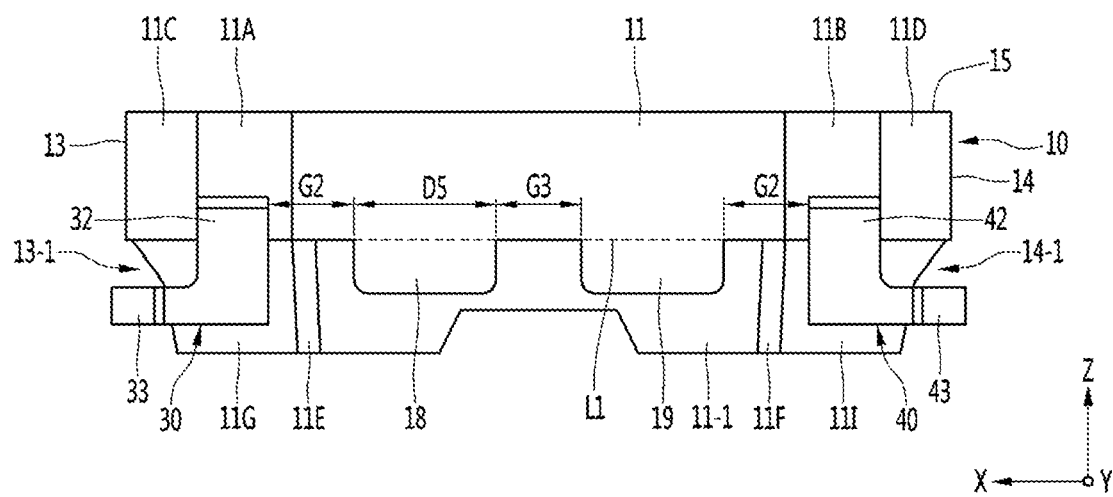
FIG. 6 is a bottom view of the light emitting device package of FIG. 1.
Figure 7:
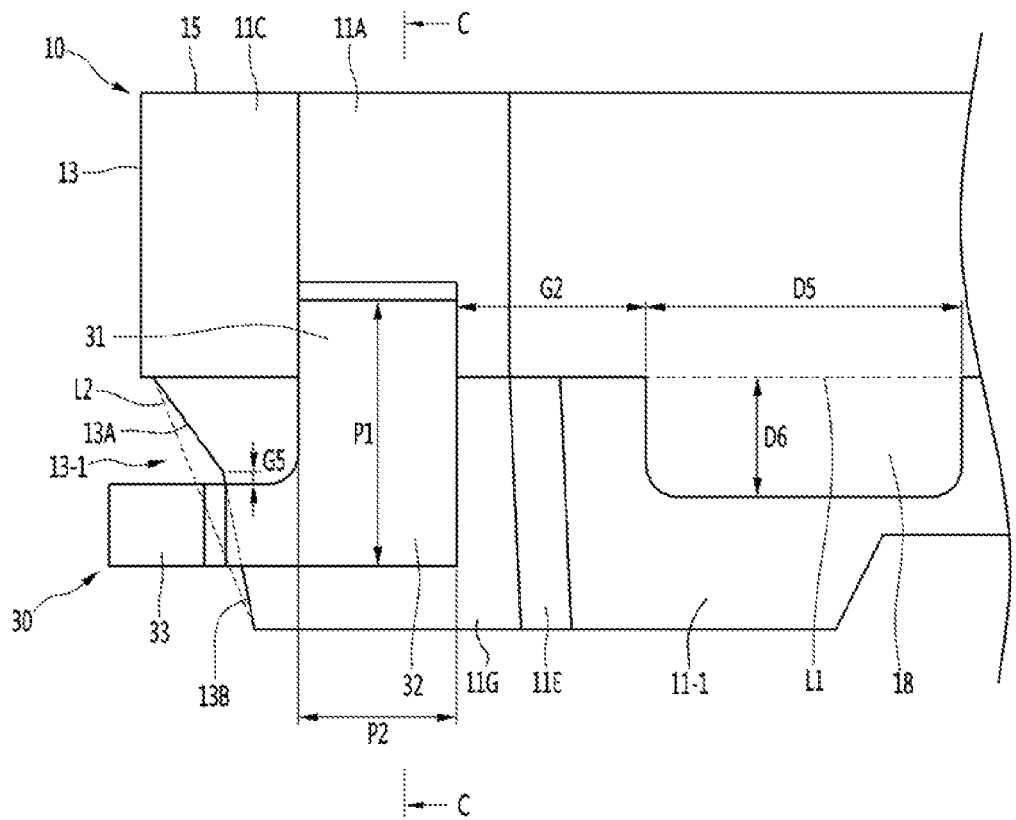
FIG. 7 is a partially enlarged view of the light emitting device package of FIG. 6.

Referring to FIGS. 6 and 7, in the first side surface part 11 of the body 10, flat areas 18 and 19 may be provided between the first bonding part 32 of the first lead frame 30 and the second bonding part 42 of the second lead frame 40. The flat areas 18 and 19 may be provided rear than a horizontal extension line L1 of the first and second lead parts 31 and 41 of the lead frames 30 and 40, and the plane surface of the first side surface part 11 may be horizontally extended. The flat areas 18 and 19 may include a plurality of flat areas spaced apart from each other, for example, a first flat area 18 and a second flat area 19. The first flat area 18 may be provided between the first bonding part 32 and the second flat area 19, and the second flat area 19 may be provided between the second bonding part 42 and the first flat area 18. The flat areas 18 and 19 may be extended on the first part area 11-1 of the first side surface part 11. The first and second flat areas 18 and 19 may be the same plane surface as the horizontal plane surface of the first side surface part 11, and may prevent the body 10 from being tilted in the rearward direction of the first side surface part 11. A length D5 of the first and second flat areas 18 and 19 may be greater than a width D6. The length D5 may be 0.4 mm or more, for example, in the range of 0.4 mm to 0.6 mm, and the width D6 may be equal to or more than 0.15 mm, for example, in the range of 0.17 mm to 0.21 mm. The length D5 of the first and second flat areas 18 and 19 may be a length in the X axis direction, and the width D6 may be a length in the Z axis direction.

In the case in which the first and second flat areas 18 and 19 are smaller than the above range, a portion of the fifth side surface part 15 of the light emitting device package 100 may be lifted and light directivity characteristics may be changed, and in the case of exceeding the above range, a degree of improvement may be insignificant. The length D5 of the first and second flat areas 18 and 19 may be greater than a width P2 of the first and second bonding parts 32 and 42, and it may balance the bottom center area of the body 10. The flat areas 18 and 19 may correspond to the first lead part 31 provided on the cavity 20 in the area of the first side surface part 11 and may be spaced apart from the second lead part 41. The first and second flat areas 18 and 19 may be overlapped with the first lead part 31 in the thickness direction of the body 10.

A gap G3 between the first and second flat areas 18 and 19 may be equal to a gap G2 between the first flat area 18 and the second bonding part 32 or a gap G2 between the second flat area 19 and the second bonding part 42. The first and second bonding parts 32 and 42 and the first and second flat areas 18 and 19 having the gaps G2 and G3 may prevent the bottom surface of the body 10 from being tilted. When the ratio of the gaps G2 and G3 in the first side surface part 11 of the body 10 is considered, the ratio G2:G3 may be in the range of 1:1 to 2:1 or may satisfy the relation of G3≤G2. The gap G3 between the first and second flat areas 18 and 19 may be reduced when the length D5 of the first and second flat areas 18 and 19 are increased, and the gap G2 between the bonding parts 32 and 42 may not be easily changed due to the position, structure, and width of the bonding parts 32 and 42.

The length D5 of the first and second flat areas 18 and 19 may be larger than the gaps G2 and G3, for example, the length D5 may be larger than the gaps G2 or G3 by 150% or more. As the length D5 of the first and second flat areas 18 and 19 are provided larger than the gaps G2 and G3, the first and second flat areas 18 and 19 may function as flat supporting parts in both areas between the first and second bonding parts 32 and 42. The sum of the length D5 of the first and second flat areas 18 and 19 may be 25% or more than the length (D2 in FIG. 1) of the body 10, for example, equal to or more than 30%, and thus the first and second flat areas 18 and 19 may balance the center area of the first side surface part 11 of the body 10. Since the first and second flat areas 18 and 19 are provided further adjacent to the center area of the first side surface part 11 of the body 10 and provided as a flat surface in an area between the first and second bonding parts 32 and 42 of the first and second lead frames 30 and 40 on the first side surface part 11 of the body 10, it may be possible to prevent the body 10 from tilting backward.

A length P1 of the flat area from the first and second bonding parts 32 and 42 of the first and second lead frames 30 and 40 may be a length in the Z axis direction, and may be provided 0.25 mm or more, for example, 0.26 mm or more. The first and second bonding parts 32 and 42 having such a length P1 may support the rear of the first side surface part 11 of the body 10, and the fifth side surface part 15 of the body 10 may be prevented from being lifted, and the problem of lowering of the directivity characteristic of light and the lowering of luminance may be solved.

In the first side surface part 11 of the body 10, first and second bonding areas 11G and 11I, in which the first and second bonding parts 32 and 42 of the first and second lead frames 30 and 40 may be placed, may be provided on the outer side of the first part area 11-1. Inclined areas 11E and 11F may be provided between the first and second bonding areas 11G and 11I and the flat first part area 11-1.

Figure 8:
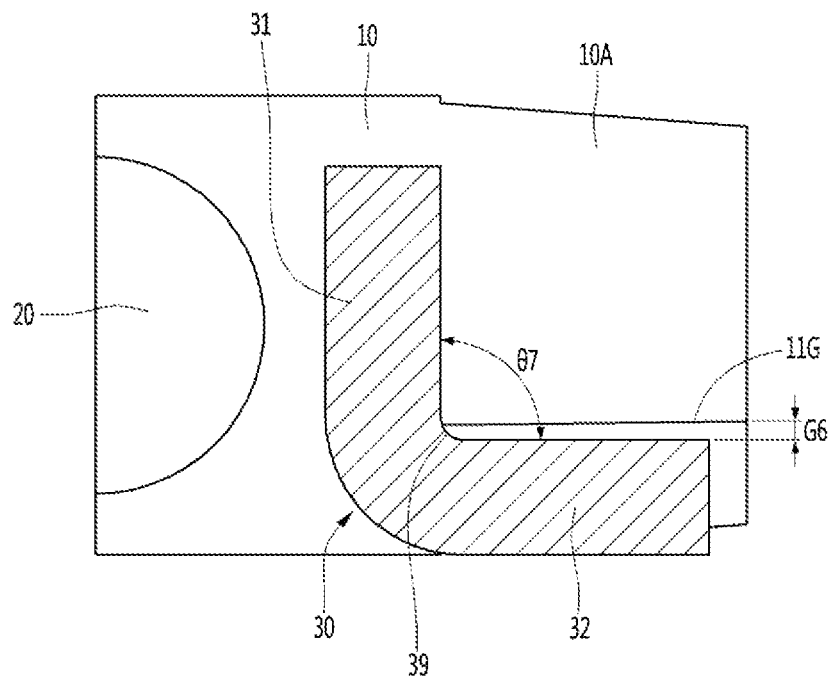
FIG. 8 is a C-C side cross-sectional view of the light emitting device package of FIG. 7.

Referring to FIGS. 7 and 8, the first bonding part 32 and the first heat radiating part 33 of the first lead frame 30 are described, and the second bonding part 42 and the second heat radiating part 43 of the second lead frame 40 are described with reference to the description of the first lead frame 30. As shown in FIGS. 7 and 8, the first bonding part 32 of the first lead frame 30 may be bent at a predetermined angle form the first lead part 31, for example, an angle ranging from 88 degrees to 91 degrees. The inner side of the first bonding part 32 may be spaced apart from the first bonding area 11G of the first side surface part 11 of the body 10 by a predetermined gap G6, for example, 0.03 mm or less. In the case in which the gap G6 between the first bonding area 11G of the body 10 and the first bonding part 32 exceeds 0.3 mm, the first bonding part 32 may be inclined. Accordingly, the problem in which the body 10 is tilted may be generated, and the first heat radiating part 33 may not be in close contact with the body 10. The first heat radiating part 33 of the first lead frame 30 may be bent from the first bonding part 32 and may be extended to the third side surface part 13 of the body 10. The first heat radiating part 33 may be bent at an angle θ7 of 89 degrees to 91 degrees from the first bonding part 32 and may be in close contact with the third side surface part 13.

As shown in FIGS. 4, 6, and 7, among the third and fourth side surface parts 13 and 14 of the body 10, in an area adjacent to the sixth side surface part 16, first and second recesses 13-1 and 14-1, in which the first and second heat radiating parts 33 and 43 of the first and second lead frames 30 and 40 may be provided, may be provided. As shown in FIG. 4, the first recess 13-1 may be a recessed area adjacent to the sixth side surface part 16 of the area of the third side surface part 13. The second recess 14-1 may be a recessed area adjacent to the sixth side surface part 16 of the fourth side surface part 14. The first recess 13-1 may be provided outside the second body part 10B among the third side surface part 13, and the second recess 14-1 may be provided outside the second body part 10B of the fourth side surface part 14. The first heat radiating part 33 of the first lead frame 30 may be provided on the first recess 13-1, and the second heat radiating part 43 of the second lead frame 40 may be provided on the second recess 14-1. The first recess 13-1 may have a depth gradually deeper from the vertical straight line toward the sixth side surface part 16, and the second recess 14-1 may have a depth gradually deeper from the vertical straight line toward the sixth side surface part 16.

The first and second heat radiating parts 33 and 43 may be extended from the first and second bonding parts 32 and 42 to the first and second recesses 13-1 and 14-1 and may improve the heat radiation efficiency. A plurality of inclined areas, for example, two or more areas inclined at different angles each other may be provided on each of the first and second recesses 13-1 and 14-1 of the third and fourth side surface parts 13 and 14 of the body 10. The inclined areas of the first and second recesses 13-1 and 14-1 may be positioned on a side surface different from a plane in which the first and second bonding parts 32 and 42 may be provided, and may be an area in which the first and second heat radiating parts 33 and 43 may be provided.

As shown in the first and second recesses 13-1 and 14-1 of the third and fourth side surface parts 13 and 14 of the body 10, first and second areas 13A and 14A inclined from the third side surface part 13 and the fourth side surface part 14, and third and fourth areas 13B and 14B inclined from the first and second areas 13A and 14A may be included. The first and second areas 13A and 14A may be a concave area from the straight line in the Z axis direction of the third side surface part 13 and the fourth side surface part 14, and the third and fourth areas 13B and 14B may be an area between the first and second areas 13A and 14A and the first part 16A and the second part 16B of the sixth side surface part 16. The inclined surface of the first and second areas 13A and 14A may be provided at a first angle θ2 of an acute angle with respect to a vertical line, and the inclined area of the third and fourth areas 13B and 14B may be provided at a second angle θ3 of an acute angle with respect to the vertical line. The first angle θ2 is an angle between a straight line extended from the third and fourth side surface parts 13 and 14 or the third axis direction and the inclined surface of the first and second areas 13A and 14A. The second angle θ3 is an angle between the straight line or the third axis direction and the inclined surface of the third and fourth areas 13B and 14B. The first and second areas 13A and 14A may be inclined with respect to a vertical straight line to the third and fourth side surface parts 13 and 14 of the body 10, and the third and fourth areas 13B and 14B may be extended from the first and second areas 13A and 14A to the surface of the sixth side surface part 16.

An angle between the first area 13A and the third area 13B or an angle θ1 between the second area 13B and the fourth area 14B may be an obtuse angle. The angle θ1 may be for example, in a range of 155±5 degrees, and the inclined first angle θ2 of the first and second areas 13A and 14A may be larger than the inclined second angle (θ3<θ2) of the third and fourth areas 13B and 14B. The first angle θ2 of the first and second areas 13A and 14A may be 50 degrees or less, for example, 40 degrees or less, and the second angle θ3 of the third and fourth areas 13B and 14B may be 20 degrees or less, for example, 15 degrees or less. As the third and fourth areas 13B and 14B area inclined at the above angle from the first and second areas 13A and 14A, the first and second heat radiating parts 33 and 43 provided on the third and fourth areas 13B and 14B may be in close contact with the third and fourth areas 13B and 14B after being bent.

The first and second recesses 13-1 and 14-1 of the third and fourth side surface parts 13 and 14 may be provided on the rear portion of the body 10, for example, outside the first part area 11-1 and the second part area 12-1. As the inclined angle of the first and second areas 13A and 14A may be inclined at an angle larger than the inclined angle of the third and fourth areas 13B and 14B, the first and second heat radiating parts 33 and 43 provided on the third and fourth areas 13B and 14B may be in close contact. As the first and second areas 13A and 14A and the third and fourth areas 13B and 14B provide an inclined surface, the separation from the molding frame during injection molding of the body 10 may be done easily.

A depth B3 of the first and second areas 13A and 14A may be greater than a depth B4 of the third and fourth areas 13B and 14B. The first depth B3 of the first and second areas 13A and 14A may be in the range of 0.13 mm±0.02 mm in the Z axis direction of or from a vertical straight line of the third and fourth side surface parts 13 and 14, and the second depth B4 of the third and fourth areas 13B and 14B may be in the range of 0.05 mm±0.02 mm from a vertical straight line (Z axis direction) of the boundary region with the first and second areas 13A and 14A. Since the first and second areas 13A and 14A and the third and fourth areas 13B and 14B have the first and second depths B3 and B4, the first and second heat radiating parts 33 and 43 of the first and second lead frames 30 and 40 may be accommodated closely. The first and second heat radiating parts 33 and 43 of the first and second lead frames 30 and 40 may be coupled in a structure in which an outer side part thereof protrudes from the third and fourth side surface parts 13 and 14 of the body 10. As the first and second areas 13A and 14A are provided to be inclined to have the first depth, the first and second heat radiating parts 33 and 43 may be in close contact with the third and fourth areas 13B and 14B.

The first and second areas 13A and 14A may be provided to overlap with the depression parts 35 and 45 of the third and fourth side surface parts 13 and 14 in the third axis direction. The first and second areas 13A and 14A may be provided adjacent to the depression parts 35 and 45. The first and second recesses 13-1 and 14-1 may be positioned on opposite sides of the body 10 from each other in the first axis direction.

A height B2 of the third and fourth areas 13B and 14B may be greater than a height B1 of the first and second areas 13A and 14A. The height B1 of the first and second areas 13A and 14A may be spaced apart from the rear surface of the first and second lead parts 31 and 41 by 0.15 mm±0.02 mm, and the height B2 of the third and fourth areas 13B and 14B may be spaced apart in the range of 0.25 mm±0.04 mm. The boundary portion between the first and second areas 13A and 14A and the third and fourth areas 13B and 14B may be spaced apart from the sixth side surface part 16 of the body 10 in the range of 0.25 mm±0.04 mm. The height B2 of the third and fourth areas 13B and 14B may be at least 0.1 mm or more larger than the height (B1<B2) of the first and second areas 13A and 14A, and may be provided more than 50% of the width B0 of the first part area 11-1 and the second part area 12-1 of the body 10 shown in FIG. 4. As the height B2 of the third and fourth areas 13B and 14B is large and the second depth B4 is low and inclined at a small angle, the first and second heat radiating parts 33 and 43 may be in close contact on the third and fourth areas 13B and 14B, and accordingly, the first and second heat radiating parts 33 and 43 may be prevented from influencing the first and second bonding parts 32 and 42. The widths of the first and second heat radiating parts 33 and 43 of the first and second lead frames 30 and 40 provided in the third and fourth areas 13B and 14B may be increased, and thus, heat radiation efficiency may also be improved.

As the concave first and second recesses 13-1 and 14-1 of the third and fourth side surface parts 13 and 14 of the body 10 provide a structure inclined at least in two stages, the first and second bonding parts 32 and 42 and the first and second heat radiating parts 33 and 43 may be further in close contact with the body 10 as compared with the structure (L2 line in FIG. 7) inclined in one stage. Also, as the first and second heat radiating parts 33 and 43 are bent on the basis of the boundary point between the first and second areas 13A and 14A and the third and fourth areas 13B and 14B, the first and second heat radiating parts 33 and 43 may be in close contact with the third and fourth areas 13B and 14B at a right angle or an angle close thereto from the first and second bonding parts 32 and 42. Accordingly, the first and second bonding parts 32 and 42 may be provided in a uniformly horizontal plane. In the case in which the rear area of the third side surface part 13 is inclined in one stage, like the L2 line of FIG. 7, the distance between the first heat radiating part 33 and the rear area may be further increased, and since the first heat radiating part 33 is not in close contact, there may be a problem in which, after the first heat radiating part 33 is bent, the uniform plane of the first bonding part 32 may be affected.

Figure 9:
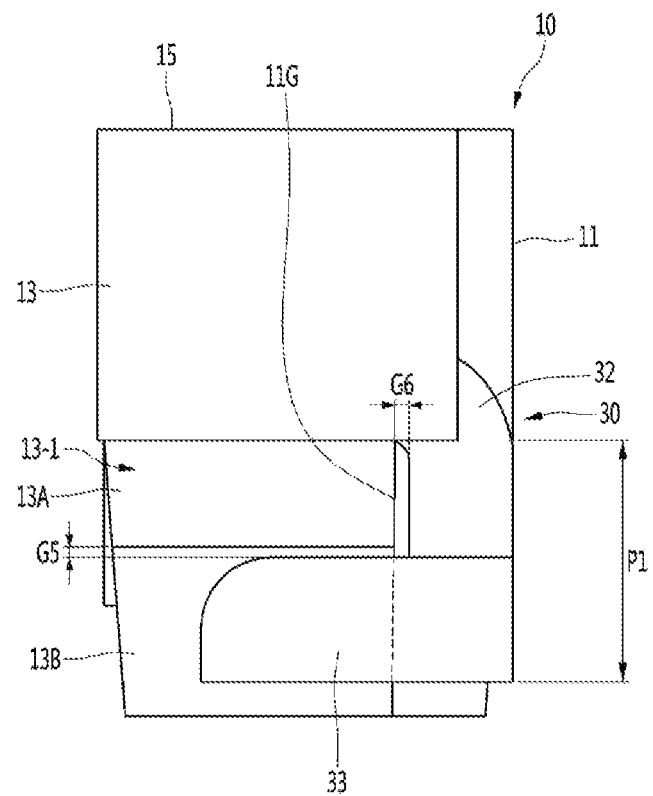
FIG. 9 is a side view of the light emitting device package of FIG. 1.

Referring to FIG. 9, a boundary portion between the first recess 13-1 of the third side surface part 13 and the first and third areas 13A and 13B may be provided above the first heat radiating part 33. The first heat radiating part 33 may be spaced from the boundary portion between the first and third areas 13A and 13B by a predetermined gap G5, for example, 0.02 mm±0.01 mm. When the first heat radiating part 33 is spaced apart from the boundary portion of the first and third areas 13A and 13B more than the above range, the close contact effect of the first heat radiating part 33 may be reduced and the heat radiation area may be also reduced.

Figure 10:
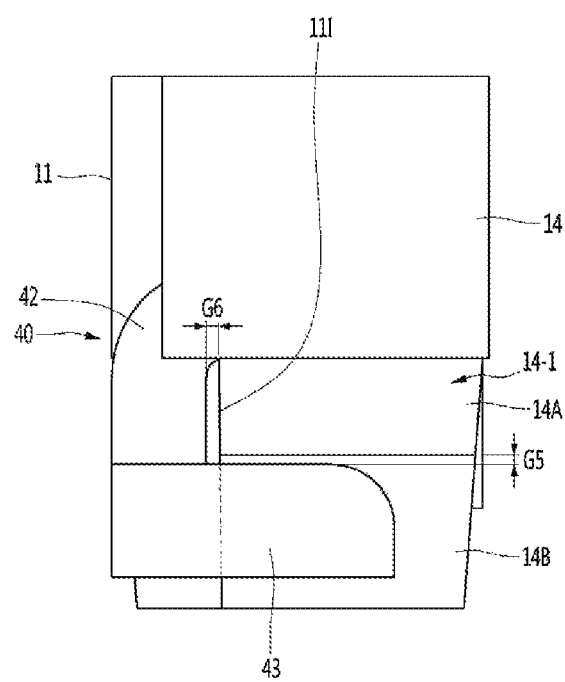
FIG. 10 is another side view of the light emitting device package of FIG. 1.

Referring to FIG. 10, the second bonding part 42 of the second lead frame 40 may have the predetermined gap G6 from the second bonding area 11I of the first side surface part 11 of the body 10. For example, it may be in close contact within 0.03 mm or less. When the gap G6 between the second bonding area 11I of the body 10 and the second bonding part 42 exceeds 0.3 mm, the second bonding part 42 may be provided to be inclined and the body 10 may be tilted and the second heat radiating part 43 may not be in close contact with the body 10. The boundary portion between the second recess 14-1 of the fourth side surface part 14 and the second and fourth areas 14A and 14B may be provided above the second heat radiating part 43. The second heat radiating part 43 may be spaced from the boundary portion between the second and fourth areas 14A and 14B by the predetermined gap G5, for example, in the range of 0.02 mm±0.01 mm. In the case in which the second heat radiating part 43 is separated from the boundary portion between the second and fourth areas 14A and 14B more than the above range, the adhesion effect of the second heat radiating part 43 may be reduced and the heat radiating area may be also reduced.

Figure 11:
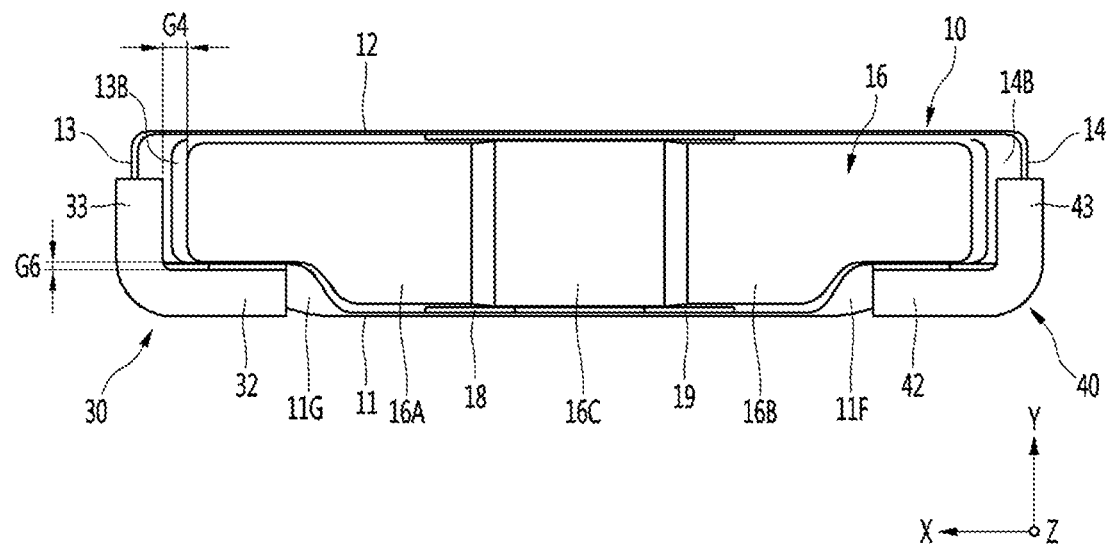
FIG. 11 is a rear view of the light emitting device package of FIG. 1.

Referring to FIG. 11, a maximum distance G4 between the third and fourth areas 13B and 14B of the third and fourth side surface parts 13 and 14 of the body 10 and the first and second heat radiating parts 33 and 43 may be provided at 0.1 mm or less, for example, 0.08 mm or less. As the first and second heat radiating parts 33 and 43 are in close contact with the third and fourth areas 13B and 14B, the gap G6 between the first and second bonding parts 32 and 42 connected to the first and second heat radiating parts 33 and 43 and the body 10 may be reduced, and the first and second bonding parts 32 and 42 may be provided in a uniform horizontal plane.

The second lead frame 40 may be described with reference to the first lead frame 30. The second heat radiating part 43 of the second lead frame 40 may be closely provided on the fourth area 14B of the fourth side surface part 14 so that the second heat radiating part 43 may provide a uniformly horizontal plane.

Figure 12:
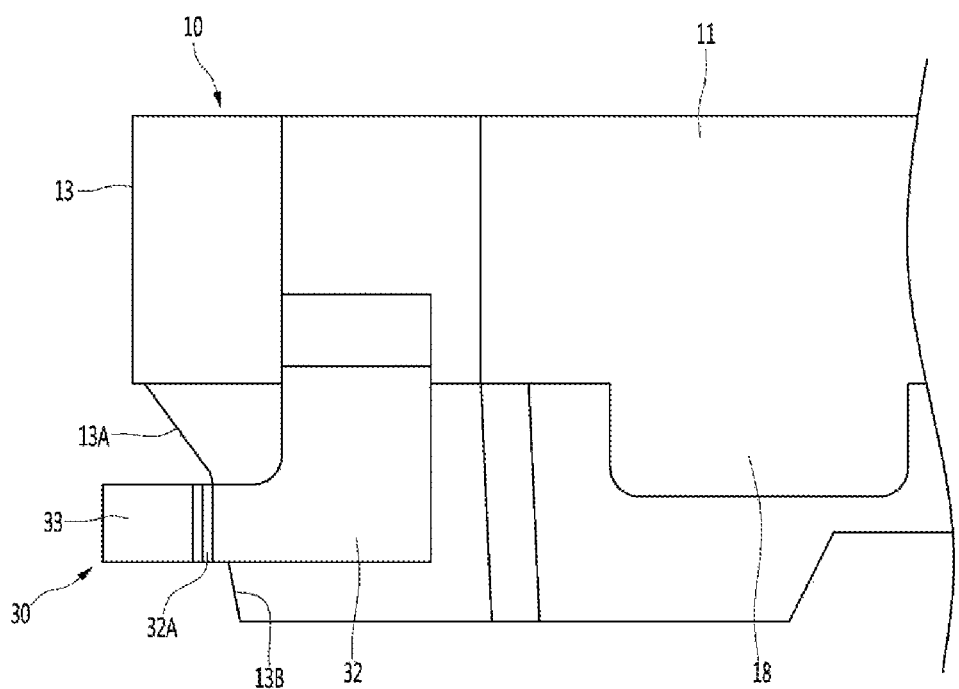
FIG. 12 and FIG. 13 are views of a lead frame having a notch and a bending process thereof as another example of the light emitting device package of FIG. 1.
Figure 13:
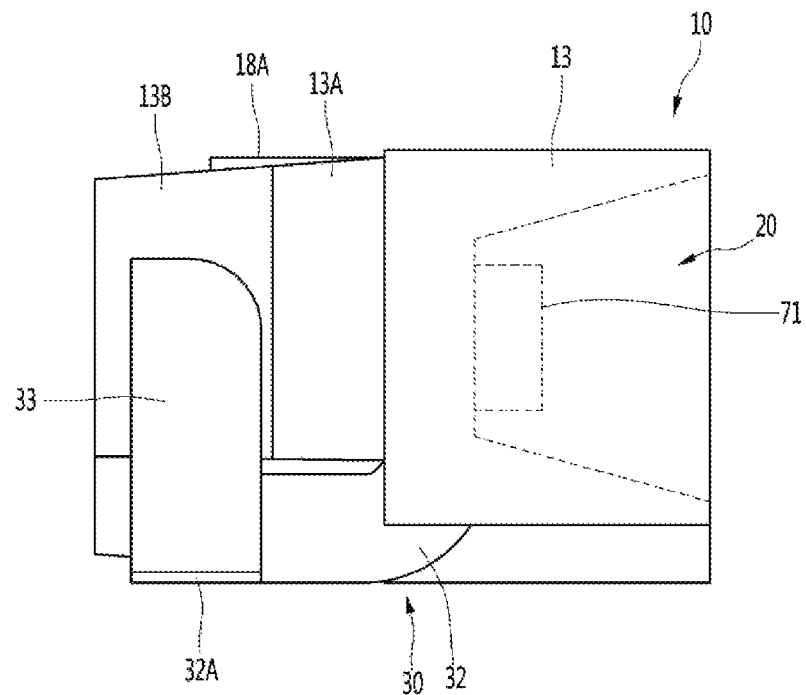

Referring to FIGS. 12 and 13, the first lead frame 30 may have a notch 32A in a boundary region between the first heat radiating part 33 and the first bonding part 32 and may bend the first heat radiating part 33 from the first bonding part 32 along the notch 32A. A direction of the notch may be arranged vertically. Due to such a notch 32A, the first heat radiating part 33 may be further in close contact with the third area 13B and may not affect the first bonding part 32.

The first lead frame 30 may further have a notch at a bent portion between the first lead part 31 and the first bonding part 32, but the present disclosure is not limited thereto. The second lead frame 40 may also have a notch at the bent portion, but the present disclosure is not limited thereto. The lead frame structure of FIGS. 12 and 13 may be applied to the structures and the description of FIGS. 1 to 11 described above.

Figure 14:
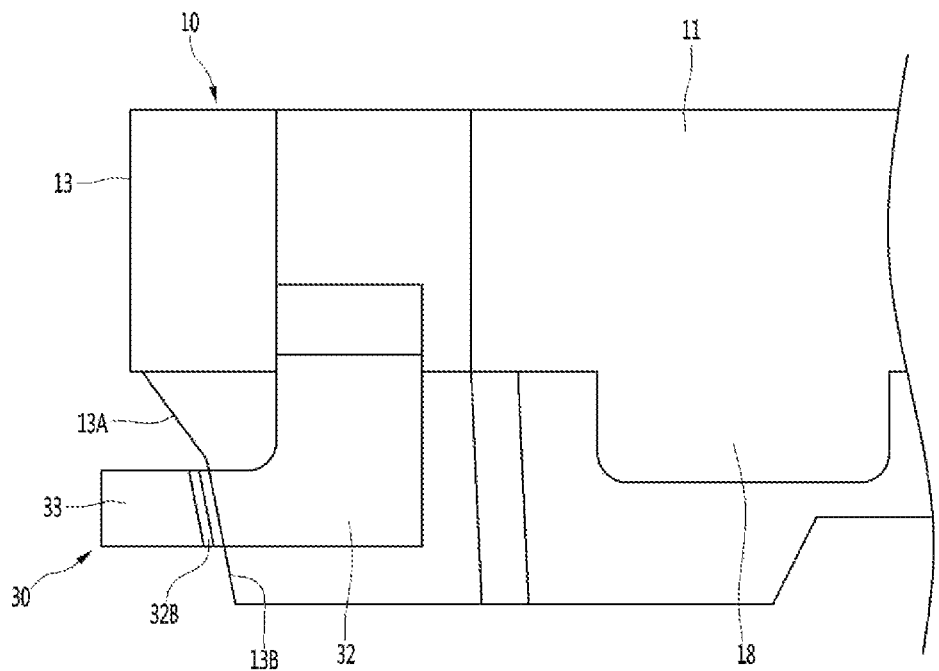
FIG. 14 and FIG. 15 are views of a lead frame having a notch and a bending process thereof as another example of the light emitting device package of FIG. 1.
Figure 15:
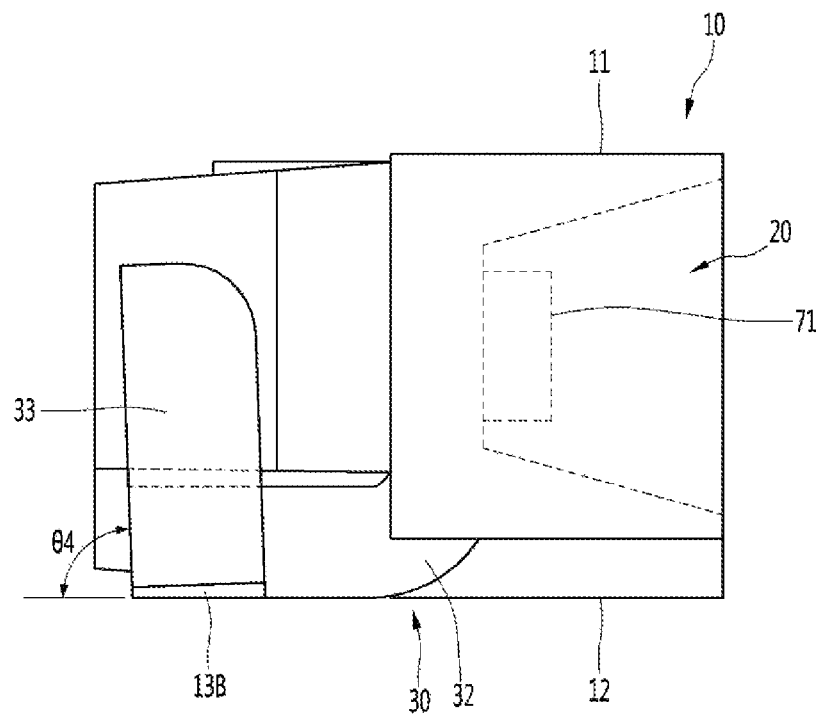

Referring to FIGS. 14 and 15, the first lead frame 30 may have a notch 32B in a boundary region between the first heat radiating part 33 and the first bonding part 32, and may bend the first heat radiating part 33 from the first bonding part 32 along the notch 32B. The notch direction may be provided in an inclined direction of the third area 13B of the third side surface part 13 of the body 10. The first heat radiating part 33 may be more closely contacted to the third area 13B by the notch 32B and may not affect the first bonding part 32. The first heat radiating part 33 may be bent at an angle θ4 less than 90 degrees with respect to a horizontal straight line by a notch. The first lead frame 30 may further have a notch at a bent portion between the first lead part 31 and the first bonding part 32, but the present disclosure is not limited thereto. The second lead frame 40 may also have a notch at the bent portion, but the present disclosure is not limited thereto. The lead frame structure of FIGS. 14 and 15 may be applied to the structure and description disclosed in FIGS. 1 to 11 described above.

The light emitting chip 71 provided in the cavity 20 of the light emitting device package 100 according to the embodiment may be provided singularly or in plural. The light emitting chip 71 may be selected from, for example, a red LED chip, a blue LED chip, a green LED chip, and a yellow green LED chip.

As shown in FIGS. 3 to 5, a molding member 81 may be provided in the cavity 20 of the body 10, and the molding member 81 may include a light transmitting resin such as silicone or epoxy and may be formed in a single layer or multiple layers. A phosphor may be included on the molding member 81 or the light emitting chip 71 for changing the wavelength of emitted light. The phosphor excites a part of the light emitted from the light emitting chip 71 and emits the excited light as light of a different wavelength. The phosphor may be selectively formed from a quantum dot, a YAG, a TAG, a silicate, a nitride, and an oxynitride-based material. The phosphor may include at least one of a red phosphor, a yellow phosphor, and a green phosphor, but the present disclosure is not limited thereto. The surface of the molding member 61 may be formed in a flat shape, a concave shape, a convex shape, or the like, but is not limited thereto. As another example, a translucent film having a phosphor may be provided on the cavity 20, but the present disclosure is not limited thereto.

A lens may be further formed on the body 10, and the lens may include a concave and/or convex lens structure and may adjust the light distribution of the light emitted from the light emitting device package 100. A semiconductor device such as a light receiving device or a protection device may be mounted on the body 10 or any one of the lead frames, and the protection device may be implemented as a thyristor, a Zener diode, or a TVS (Transient Voltage Suppression), and the Zener diode protects the light emitting chip 71 from electrostatic discharge (ESD).

Referring to FIGS. 16 and 17, as a light emitting apparatus, the light emitting module may include at least one or a plurality of light emitting device packages 100 provided on the circuit board 201. The circuit board 201 may include a board on which a circuit pattern is printed on an insulating layer, and may include, for example, a resin-based printed circuit board (PCB), a metal core PCB, a flexible PCB, a ceramic PCB, and an FR-4 substrate.

The circuit board 201 may include a metal core PCB, and the metal core PCB may further include a metal layer having higher heat radiation efficiency than other resin based substrates. For example, the metal core PCB may include a stacked structure of a metal layer, an insulating layer on the metal layer, and a wiring layer on the insulating layer, and the metal layer may be formed to have a thickness of 0.3 mm or more of a metal having a good thermal conductivity to increase the heat radiation efficiency. The first and second lead parts 31 and 41 of the light emitting device package 100 may be bonded to electrode patterns 213 and 215 of the circuit board 201 with solder or a conductive tape which is conductive bonding members 203 and 205.

Figure 18:
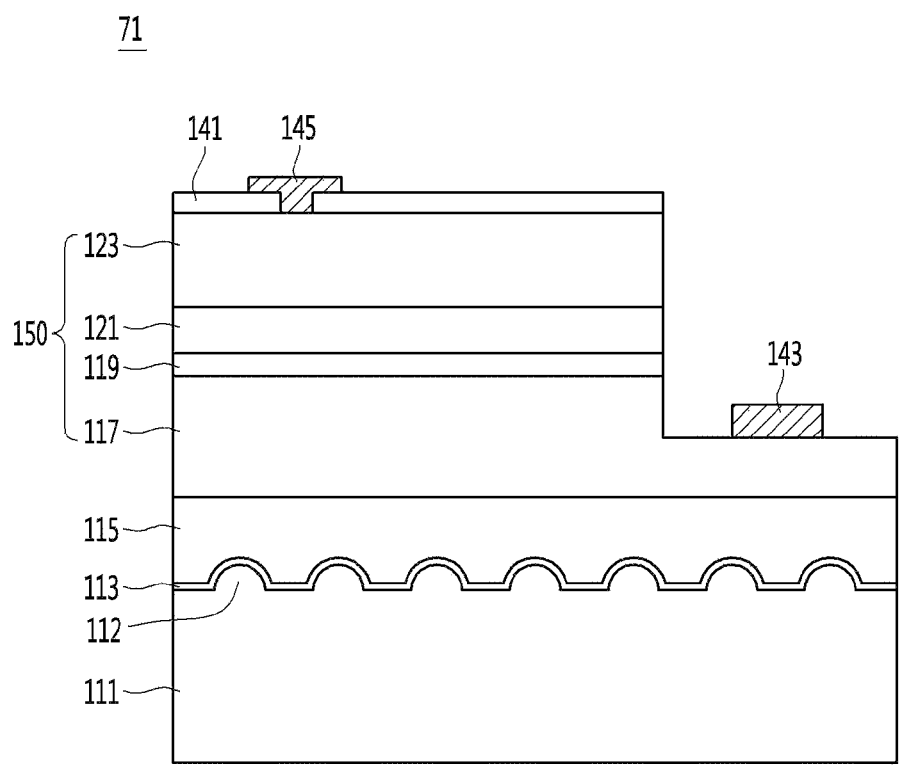
FIG. 18 is a view of a light emitting chip of the light emitting device package according to an embodiment.

Referring to FIG. 18, the light emitting chip 71 may include a substrate 111, a buffer layer 113, a low conductivity layer 115, a first conductivity type semiconductor layer 117, an active layer 119, a second clad layer 121, and a second conductivity type semiconductor layer 123. The substrate 111 may use a transparent, insulating, or conductive substrate, for example, at least one of sapphire ($Al_2O_3$), SiC, Si, GaAs, GaN, ZnO, Si, GaP, InP, Ge, $Ga_2O_3$, and $LiGaO_3$. A plurality of protrusion parts 112 may be formed on the upper surface of the substrate 111, and the plurality of protrusion parts 112 may be formed by etching of the growth substrate 111 or may be formed in a light extraction structure such as separate roughness. The protrusion part 112 may be a stripe shape, a hemispherical shape, or a dome shape. The thickness of the substrate 111 may range from 30 µm to 150 µm, but is not limited thereto.

A plurality of compound semiconductor layers may be grown on the substrate 111. Growth equipment for the plurality of compound semiconductor layers may be formed by an electron beam evaporator, physical vapor deposition (PVD), chemical vapor deposition (CVD), plasma laser deposition (PLD) dual-type thermal evaporator sputtering, metal organic chemical vapor deposition (MOCVD), and the like, but the present disclosure is not limited thereto.

A buffer layer 113 may be formed on the substrate 111 and the buffer layer 113 may be formed of at least one layer by using Group II to VI compound semiconductors. The buffer layer 113 may include a semiconductor layer using a Group III-V compound semiconductor, and includes, for example, at least one of compound semiconductors such as GaN, InN, AlN, InGaN, AlGaN, InAlGaN, and AlInN as a semiconductor having a composition formula of $In_xAl_yGa_{1-x-y}N$ ($0 \leq x \leq 1$, $0 \leq y \leq 1$, $0 \leq x+y \leq 1$). The buffer layer 113 may be formed in a super lattice structure by alternately disposing different semiconductor layers.

The buffer layer 113 may be formed to mitigate the difference in lattice constants between the substrate 111 and a nitride-based semiconductor layer, and may be defined as a defect control layer. The buffer layer 113 may have a value between lattice constants between the substrate 111 and the nitride-based semiconductor layer. The buffer layer 113 may be formed of an oxide such as a ZnO layer, but is not limited thereto. The buffer layer 113 may be formed in a range of 30 to 500 nm, but is not limited thereto.

The low conductivity layer 115 may be formed on the buffer layer 113. The low conductivity layer 115 may be an undoped semiconductor layer and may have lower electrical conductivity than the first conductivity type semiconductor layer 117. The low conductivity layer 115 may be formed of a GaN-based semiconductor using a Group III-V compound semiconductor, and the undoped semiconductor layer may have a first conductive type property without intentionally doping a conductive type dopant. The undoped semiconductor layer may not be formed, but the present disclosure is not limited thereto. The low conductivity layer 115 may be formed between a plurality of first conductivity type semiconductor layers 117.

The first conductivity type semiconductor layer 117 may be formed on the low conductivity layer 115. The first conductivity type semiconductor layer 117 may be formed of a Group III-V compound semiconductor doped with a first conductive type dopant, and for example, may be formed of a semiconductor material having a composition formula of $In_xAl_yGa_{1-x-y}N$ ($0 \leq x \leq 1$, $0 \leq y \leq 1$, $0 \leq x+y \leq 1$). In the case in which the first conductivity type semiconductor layer 117 is an n-type semiconductor layer, the first conductive type dopant may be an n-type dopant including Si, Ge, Sn, Se, and Te. At least one of the low conductivity layer 115 and the first conductivity type semiconductor layer 117 may have a super lattice structure in which a first layer and a second layer which are different from each other may be alternately arranged.

A first clad layer may be formed between the first conductivity type semiconductor layer 117 and the active layer 119, and the first clad layer may be formed of a GaN-based semiconductor. The first clad layer serves to constrain a carrier. As another example, the first clad layer may be formed of an InGaN layer or an InGaN/GaN superlattice structure, but is not limited thereto. The first clad layer may include an n-type or p-type dopant, and may be formed of, for example, a first conductive or a low conductivity type semiconductor layer.

The active layer 119 may be formed on the first conductivity type semiconductor layer 117. The active layer 119 may be formed of at least one of a single well, a single quantum well, a multi-well, a multiple quantum well (MQW), a quantum wire, and a quantum dot structure. The active layer 119 may have a well layer and a barrier layer alternately arranged therein, and the well layer may be a well layer having a continuous energy level. Also, the well layer may be a quantum well in which energy levels are quantized. The well layer may be defined as a quantum well layer, and the barrier layer may be defined as a quantum barrier layer. The pair of the well layer and the barrier layer may be formed in 2 to 30 cycles. The well layer may be formed of a semiconductor material having a composition formula of $In_xAl_yGa_{1-x-y}N$ ($0 \leq x \leq 1$, $0 \leq y \leq 1$, $0 \leq x+y \leq 1$). The barrier layer may be a semiconductor layer having a band gap wider than the band gap of the well layer, and for example, may be formed of a semiconductor material having a composition formula of $In_xAl_yGa_{1-x-y}N$ ($0 \leq x \leq 1$, $0 \leq y \leq 1$, $0 \leq x+y \leq 1$). The pair of the well layer and the barrier layer may include at least one of InGaN/GaN, GaN/AlGaN, InGaN/AlGaN, and InGaN/InGaN, for example. The active layer 119 may selectively emit light within a wavelength range from the ultraviolet band to the visible light band, and may emit a peak wavelength in the range of 420 nm to 450 nm, for example.

The second clad layer 121 may be formed on the active layer 119. The second clad layer 121 may have a higher band gap than the band gap of the barrier layer of the active layer 119, and may be formed of a Group III-V compound semiconductor, for example, a GaN-based semiconductor. For example, the second clad layer 121 may include GaN, AlGaN, InAlGaN, InAlGaN superlattice structures, and the like. The second clad layer 121 may include an n-type or p-type dopant, and may be formed of a second conductivity type or a low conductivity type semiconductor layer.

The second conductivity type semiconductor layer 123 may be formed on the second clad layer 121 and the second conductivity type semiconductor layer 123 may include a dopant of a second conductive type. The second conductivity type semiconductor layer 123 may be formed of a Group III-V compound semiconductor, for example, at least one of GaN, InN, AlN, InGaN, AlGaN, InAlGaN, and AlInN, and includes a single layer or multiple layers. In the case in which the second conductivity type semiconductor layer 123 is a p-type semiconductor layer, the second conductive dopant may include Mg, Zn, Ca, Sr, or Ba as a p-type dopant.

Conductive types of the layers of a light emitting structure 150 may be formed to be reversed, and for example, the second conductivity type semiconductor layer 123 may be implemented as an n-type semiconductor layer, and the first conductivity type semiconductor layer 117 may be implemented as a p-type semiconductor layer. Also, an n-type semiconductor layer, which may be a third conductivity type semiconductor layer having a polarity opposite to the polarity of the second conductivity, may be further formed on the second conductivity type semiconductor layer 123. The light emitting chip 71 may be defined as the light emitting structure 150 of the first conductivity type semiconductor layer 117, the active layer 119 and the second conductivity type semiconductor layer 123, and the light emitting structure 150 may include at least one of an n-p junction structure, a p-n junction structure, an n-p-n junction structure, and a p-n-p junction structure. In the n-p and p-n junctions, an active layer may be provided between two layers, and an n-p-n junction or a p-n-p junction may include at least one active layer between three layers.

An electrode layer 141 and a second electrode 145 may be formed on the light emitting structure 150 and a first electrode 143 may be formed on the first conductivity type semiconductor layer 117. The electrode layer 141 may be formed of a material having permeability and electrical conductivity as a current diffusion layer. The electrode layer 141 may be formed to have a refractive rate lower than that of the compound semiconductor layer.

The electrode layer 141 may be formed on the upper surface of the second conductivity type semiconductor layer 123, and the material thereof may be selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, IrOx, RuOx, and NiO and may be formed of at least one layer. The electrode layer 141 may be formed of a reflective electrode layer, and for example, that material may be selectively formed of Al, Ag, Pd, Rh, Pt, Ir, or an alloy of two or more thereof.

The second electrode 145 may be formed on the second conductivity type semiconductor layer 123 and/or the electrode layer 141, and may include an electrode pad. The second electrode 145 may further have a current diffusion pattern of an arm structure or a finger structure. The second electrode 145 may be made of a metal having characteristics of an ohmic contact, an adhesive layer, and a bonding layer, and may be made non-transparent, but it is not limited thereto. The first electrode 143 may be formed on a part of the first conductivity type semiconductor layer 117. The first electrode 143 and the second electrode 145 may be formed of a metal such as Ti, Ru, Rh, Ir, Mg, Zn, Al, In, Ta, Pd, Co, Ni, Si, Ge, Ag and Au, and selected alloys among those.

An insulating layer may further be formed on the surface of the light emitting chip 71. The insulating layer may prevent a short between layers of the light emitting structure 150 and prevent moisture penetration. Although the light emitting chip 71 is implemented as a chip having a horizontal electrode structure, a vertical electrode structure in which the electrodes are provided by removing the substrate 111 or disposing a groove in the substrate 111 may be used.

The light emitting module or substrate according to the embodiment(s) described above may be applied to a light unit. The light unit may include a structure in which a plurality of light emitting devices or light emitting device packages are arrayed, and the display apparatus shown in FIG. 19, another illumination lamp, a signal lamp, a vehicle headlight, an electric signboard and the like may be included.

Figure 19:
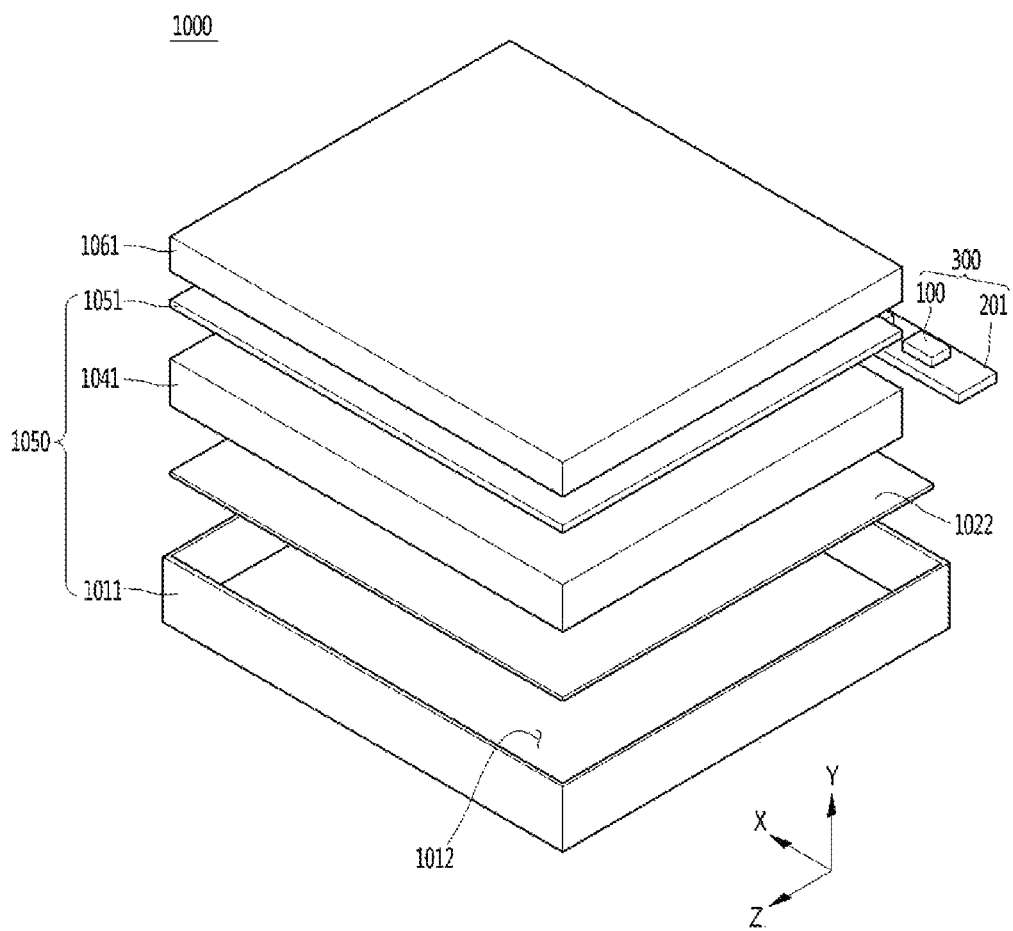
FIG. 19 is a perspective view of a display apparatus having the light emitting device package according to an embodiment.

Referring to FIG. 19, a display apparatus 1000 may include a light guide plate 1041, a light emitting module 300 providing light to the light guide plate 1041, a reflection member 1022 under the light guide plate 1041 an optical sheet 1051 on the light guide plate 1041, a display panel 1061 on the optical sheet 1051, and a bottom cover 1011 accommodating the light guide plate 1041, the light emitting module 300 and the reflection member 1022, but is not limited thereto. The bottom cover 1011, the reflection member 1022, the light guide plate 1041 and the optical sheet 1051 may be defined as a light unit 1050.

The light guide plate 1041 may diffuse light provided from the light emitting module 300 to convert the light into a surface light source. The light guide plate 1041 may be made of a transparent material, and may include, for example, one of an acrylic resin such as PMMA (polymethyl methacrylate), PET (polyethylene terephthalate), PC (polycarbonate), COC (cycloolefin copolymer) and PEN (polyethylene naphthalate) resins.

The light emitting module 300 may be provided on at least one side surface of the light guide plate 1041 to provide light to at least one side, and to serve as a light source of the display device. At least one light emitting module 300 may be provided in the bottom cover 1011 and may directly or indirectly provide light from one side of the light guide plate 1041. The light emitting module 300 may include the light emitting device package 100 provided between the boards 201 according to the embodiment. The light emitting device package 100 may be arranged on the board 201 at a predetermined interval. In the case in which the light emitting device package 100 is mounted on the side surface of the bottom cover 1011 or on the heat radiating plate, the board 201 may be removed.

The plurality of light emitting device packages 100 may be mounted on the board 201 such that a light emitting surface through which light is emitted may be spaced apart from the light guide plate 1041 by a predetermined distance, but is not limited thereto. The light emitting device package 100 may directly or indirectly provide light to a light-incident portion, which may be one side of the light guide plate 1041, but the present disclosure is not limited thereto.

The reflection member 1022 may be provided under the light guide plate 1041. The reflection member 1022 may reflect the light incident on the lower surface of the light guide plate 1041 and may supply the reflected light to the display panel 1061 to improve the brightness of the display panel 1061. The reflection member 1022 may be formed of, for example, a PET, PC, or PVC resin, but is not limited thereto. The reflection member 1022 may be the upper surface of the bottom cover 1011, but is not limited thereto.

The bottom cover 1011 may accommodate the light guide plate 1041, the light emitting module 300, the reflection member 1022, and the like. For this, the bottom cover 1011 may be provided with a housing part 1012 having a box shape with an opened top surface, but the present disclosure is not limited thereto. The bottom cover 1011 may be coupled to a top cover, but is not limited thereto. The bottom cover 1011 may be formed of a metal material or a resin material, and may be manufactured by using a process such as press molding or extrusion molding. In addition, the bottom cover 1011 may include a metal or a non-metal material having good thermal conductivity, but the present disclosure is not limited thereto.

The display panel 1061 may include, for example, as an LCD panel, first and second transparent substrates facing each other, and a liquid crystal layer interposed between the first and second substrates. A polarizing plate may be attached to at least one surface of the display panel 1061, but the present disclosure is not limited thereto. The display panel 1061 may transmit or block light provided from the light emitting module 300 to display information. The display apparatus 1000 may be applied to an image display apparatus such as portable terminals, monitors of notebook computers, monitors of laptop computers, and televisions.

The optical sheet 1051 may be provided between the display panel 1061 and the light guide plate 1041 and may include at least one light transmitting sheet. The optical sheet 1051 may include at least one of a sheet such as a diffusion sheet, a horizontal/vertical prism sheet, and a brightness enhanced sheet. The diffusion sheet may diffuse incident light, and the horizontal and/or vertical prism sheet may concentrate the incident light to the display panel 1061, and the brightness enhanced sheet may reuse lost light to improve brightness. Further, a protection sheet may be provided on the display panel 1061, but the present disclosure is not limited thereto. The light guide plate 1041 and the optical sheet 1051 may be included as an optical member on the optical path of the light emitting module 300, but the present disclosure is not limited thereto.

Embodiments disclosed herein may prevent lifting of a body in a light emitting device package. The embodiments may improve a luminance lowering of the light emitting device package and of a light emitting apparatus having the light emitting device package. The embodiments may improve reliability of the light emitting device package and the light emitting apparatus having the light emitting device package. The embodiment provides a light emitting device package which may reduce a gap between a bottom surface of a body and a bonding part of a lead frame. The embodiments may provide a light emitting device which allows a heat radiating part bent from a bonding part of a lead frame to be in close contact with a multi-stepped inclined surface provided on the lead frame and outside a body.

A light emitting device package according to embodiments disclosed herein may include a body including a first side surface part or surface, a second side surface part or surface opposite to the first side surface part, third and fourth side surface parts or surfaces which are adjacent to the first and second side surface parts and opposite each other, a fifth side surface part or surface in which a cavity is provided and a sixth side surface part or surface opposite to the fifth side surface part; a first lead frame having a first lead part or portion provided on a bottom of the cavity, a first bonding part or portion connected to the first lead part and bent at a first outer side area of the first side surface part of the body and a first heat radiating part or portion bent from the first bonding part to a first recess of the third side surface part; a second lead frame having a second lead part or portion provided on the bottom of the cavity, a second bonding part or portion connected to the second lead part and bent to a second outer side area of the first side surface part of the body, and a second heat radiating part or portion bent from the second bonding part to a second recess of the fourth side surface part; and a light emitting chip provided on at least one of the first lead part of the first lead frame and the second lead part of the second lead frame provided on the bottom of the cavity, wherein the first and second recesses are more adjacent to the sixth side surface part than the fifth side surface part, and the first and second recesses include first and second areas inclined at a first angle from the third and fourth side surface parts and third and fourth areas inclined at a second angle from the first and second areas, and the first angle is an angle between a straight line extended from the third and fourth side surface parts and an inclined surface of the first and second areas, and the second angle is an angle between the straight line and an inclined surface of the third and fourth areas, the second angle being smaller than the first angle, and the first heat radiating part of the first lead frame is provided on the third area of the third side surface part, and the second heat radiating part of the second lead frame is provided on the fourth area of the fourth side surface part.

A light emitting device package according to embodiments disclosed herein may include a body having a cavity having a longer length in a first axis direction than a length in a second axis direction; first and second lead frames provided on a bottom of the cavity; and a light emitting chip provided on at least one of the first and second lead frames, wherein the body includes first and second side surface parts or surfaces located on opposite sides in the second axis direction, and third and fourth side surface parts or surfaces located on opposite sides in the first axis direction, a fifth side surface part or surface in which the cavity is provided, and a sixth side surface part or surface which is opposite to the fifth side surface part, and the body includes a first recess inclined at a different angle to the third side surface part and a second recess having an inclined area at a different angle on the fourth side surface part, and the first lead frame includes a first lead part or portion provided at the bottom of the cavity, a first bonding part or portion provided in a first outer side area of the first side surface part of the body, and a first heat radiating part or portion bent from the first bonding part to the first recess of the third side surface part, and the second lead frame includes a second lead part or portion on the bottom of the cavity, a second bonding part or portion provided in a second outer side area of the first side surface part of the body and a second heat radiating part or portion bent from the second bonding part to the second recess of the fourth side surface part, and wherein the first and second recesses are more adjacent to the sixth side surface part than the fifth side surface part, and the first and second recesses include first and second areas inclined at a first angle from the third and fourth side surface parts and third and fourth areas inclined at a second angle from the first and second areas, and the first angle is an angle between a straight line extended from the third and fourth side surface parts and an inclined surface of the first and second areas, and the second angle is an angle between the straight line and an inclined surface of the third and fourth areas, the second angle being smaller than the first angle, and the first heat radiating part of the first lead frame is provided on the third area of the third side surface part, and the second heat radiating part of the second lead frame is provided on the fourth area of the fourth side surface part.

The first angle may have or be an acute angle, and an angle between the first and third areas may have or may be an obtuse angle. The third and fourth areas of the third and fourth side surface parts may be further closer to the sixth side surface part than the first and second areas. The first and second areas may have a first depth from a straight line extended from the third and fourth side surface parts, and the third and fourth areas may have a second depth from a straight line perpendicular to a boundary point with the first and second areas, and the first depth may be deeper than the second depth.

The first side surface part may include a plurality of flat areas which is adjacent to the sixth side surface part and extended horizontally in a direction of the sixth side surface part, and the flat areas may have a same spacing with the first heat radiating part and the second heat radiating part. The plurality of flat areas may be overlapped with the first lead frame provided in the cavity in a thickness direction of the body. The first side surface part may include a first part area adjacent to the sixth side surface part, and the first part area may have a flat surface stepped from a surface of the first side surface part without being overlapped with the cavity in the thickness direction of the body.

A depression part or depression recessed in a direction corresponding to the first and second lead parts may be included in the third and fourth side surface parts of the body. The length in the first axis direction of the body may be at least three times larger than a thickness of the body, and a center area of the bottom of the cavity may have a constant width, and the first and second side area adjacent to the third and fourth side surface parts may have a width smaller than a width of the center area.

The light emitting chip may be provided on the first lead part, and the area of the first lead part provided on the bottom of the cavity may be larger than the area of the second lead part. An inner side surface of the cavity may include an inclined surface and a vertically stepped area from the fifth side surface part of the body. A depression part or depression may be recessed in a direction corresponding to the first and second lead parts may be included in the third and fourth side surface parts of the body, and the first and second areas may be overlapped with the depression part in a third axis direction.

The first and second angles may have or be acute angles, and an angle between the first and third areas may have or may be an obtuse angle, and an angle between the second and fourth areas may have or be an obtuse angle. The first recess may have a depth gradually deeper from a straight line extended from the third side surface part toward the sixth side surface part, and the second recess may have a depth gradually deeper from a straight line extended from the fourth side surface part toward the sixth side surface part. The third and fourth areas of the third and fourth side surface parts may be closer to the sixth side surface part than the first and second areas, and a width of the first and second areas in the first axis direction may be larger than a width of the third and fourth areas.

The body may include a first body part in which the cavity is provided and a second body part which is between the first body part and the sixth side surface part, and the first side surface part may include a plurality of flat areas horizontally extended in a direction of the sixth side surface part on the second body part, and the plurality of flat areas may be provided between the first and second bonding parts. The flat areas may be overlapped with a first lead part of the first lead frame provided in the cavity in a thickness direction of the body, and the flat areas may include a first flat area which is adjacent to the first bonding part, and a second flat area which is adjacent to the second bonding part, and a distance between the first bonding part and the first flat area may be equal to or larger than a distance between the first and second flat areas, and a length of the first and second flat areas in the first axis direction may be larger than a length in the second axis direction.

In the description of the embodiments, in the case in which each layer (film), area, pattern or structure is described as being formed "on" or "under" each layer (film), area, pad or pattern, the "on" and "under" may include both of forming "directly" and "indirectly". Also, the reference for determining "on" or "under" each layer may be described based on the figures. Throughout the specification, "forward" or "front surface" may refer to a direction viewing a package from Z axis direction, and "rearward" or "rear surface" may refer to a direction viewing a package from –Z axis direction, and "left side" and "right side" may be used to show a direction viewing a package from –X axis direction and X axis direction.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body formed of an insulating material and including a first side surface, a second side surface opposite the first side surface, third and fourth side surfaces adjacent to the first and second side surfaces and opposite to each other, a fifth side surface in which a cavity is provided, and a sixth side surface opposite the fifth side surface;
a first lead frame having a first lead portion provided on a bottom of the cavity, a first bonding portion connected to the first lead portion and bent to a first outer side area of the first side surface of the body, and a first heat radiating portion bent from the first bonding portion to a first recess of the third side surface;
a second lead frame having a second lead portion provided on the bottom of the cavity, a second bonding portion connected to the second lead portion and bent to a second outer side area of the first side surface of the body, and a second heat radiating portion bent from the second bonding portion to a second recess of the fourth side surface; and
a light emitting chip provided on at least one of the first lead portion of the first lead frame or the second lead portion of the second lead frame provided on the bottom of the cavity,
wherein:
the first and second recesses are positioned closer to the sixth side surface than the fifth side surface,
the first and second recesses include first and second areas inclined at a first angle from the third and fourth side surfaces and third and fourth areas inclined at a second angle from the first and second areas,
the first angle is an angle between a straight line extended from the third and fourth side surfaces and an inclined surface of the first and second areas,
the second angle is an angle between the straight line and an inclined surface of the third and fourth areas, the second angle being smaller than the first angle,
the first heat radiating portion of the first lead frame is provided on the third area of the third side surface,
the second heat radiating portion of the second lead frame is provided on the fourth area of the fourth side surface,
the first and second side surfaces are opposite to each other with respect to a second axis direction of the body, the third and fourth side surfaces are opposite to each other with respect to a first axis direction, and the fifth and sixth side surfaces are opposite to each other with respect to a third axis direction of the body,
the third axis direction is orthogonal to the first and second axis directions, a length of the cavity in the first axis direction is greater than a height of the cavity in the second axis direction, the first side surface includes a plane surface positioned between the fifth surface and a horizontal extension line passing through the first lead portion and the second lead portion, and a plurality of flat areas positioned closer to the sixth side surface than the fifth side surface, the plurality of flat areas extend in a direction toward the sixth side surface from the horizontal extension line and at a common plane as the plane surface of the first side surface, each of the plurality of flat areas is formed of the insulating material of the body, the plurality of flat areas include a first flat area adjacent to the first bonding portion and a second flat area adjacent to the second bonding portion, and a length of the first and second flat areas in the first axis direction is greater than a width of the first and second flat areas in the third axis direction, the first flat area and the second flat area are spaced apart from each other, and the first flat area and the second flat area are spaced apart from the sixth side surface.

2. The light emitting device package of claim 1, wherein the first and second angles are acute angles, and an angle between the first and third areas is an obtuse angle.

3. The light emitting device package of claim 1, wherein the third and fourth areas of the third and fourth side surfaces are positioned closer to the sixth side surface than the first and second areas.

4. The light emitting device package of claim 3, wherein the first and second areas have a first depth from a straight line extended from the third and fourth side surfaces, and the third and fourth areas have a second depth from a straight line vertical to a boundary point of the first and second areas, and the first depth is deeper than the second depth.

5. The light emitting device package of claim 3, wherein the plurality of flat areas have a same spacing between the first bonding portion and the second bonding portion.

6. The light emitting device package of claim 1, wherein the plurality of flat areas are overlapped with the first lead portion of the first lead frame provided in the cavity in the second axis direction of the body, and wherein the light emitting chip is provided on the first lead portion.

7. The light emitting device package of claim 5, wherein the first side surface includes a first portion adjacent to the sixth side surface, and the first portion has a flat surface not overlapped with the cavity in the second axis direction of the body and stepped from a surface of the first side surface.

8. The light emitting device package of claim 3, wherein a depression is recessed in the sixth side surfaces of the body in the third axis direction toward the first and second lead portions.

9. The light emitting device package of claim 3, wherein a length in the first axis direction of the body is three times or more of a thickness of the body.

10. The light emitting device package of claim 3, wherein a center area of the bottom of the cavity has a constant width and first and second side areas adjacent to the third and fourth side surfaces have a smaller width than a width of the center area.

11. The light emitting device package of claim 3, wherein the light emitting chip is provided on the first lead portion, and an area of the first lead portion provided on the bottom of the cavity is wider than an area of the second lead portion, and a molding member is included in the cavity.

12. The light emitting device package of claim 11, wherein an inner side surface of the cavity includes an inclined surface and an area vertically stepped from the fifth side surface of the body.

13. A light emitting device package comprising:
a body including a cavity having a longer length in a first axis direction than a length in a second axis direction;
first and second lead frames provided on a bottom of the cavity; and
a light emitting chip provided on at least one of the first lead frame or the second lead frame,
wherein:
the body includes a first side surface and a second side surface positioned opposite to each other in the second axis direction, third and fourth side surfaces positioned opposite to each other in the first axis direction, a fifth side surface in which the cavity is provided, and a sixth side surface opposite to the fifth side surface, the body includes a first recess inclined at a different angle to the third side surface and a second recess having an area inclined at a different angle to the fourth side surface, and the first lead frame includes a first lead portion provided on the bottom of the cavity, a first bonding portion provided on a first outer side area of the first side surface of the body, and a first heat radiating portion bent from the first bonding portion to the first recess of the third side surface, the second lead frame includes a second lead portion provided on the bottom of the cavity, a second bonding portion provided on a second outer side area of the first side surface of the body and a second heat radiating portion bent from the second bonding portion to the second recess of the fourth side surface, the first and second recesses are positioned closer to the sixth side surface than the fifth side surface, the first and second recesses include first and second areas inclined at a first angle from the third and fourth side surfaces, and third and fourth areas inclined at a second angle from the first and second areas, the first angle is an angle between a straight line extended from the third and fourth side surfaces and an inclined surface of the first and second areas, the second angle is an angle between the straight line and an inclined surface of the third and fourth areas, the second angle being smaller than the first angle, the first heat radiating portion of the first lead frame is provided on the third area of the third side surface, the second heat radiating portion of the second lead frame is provided on the fourth area of the fourth side surface, the fifth and sixth side surfaces are opposite to each other with respect to a third axis direction of the body, the third axis direction is orthogonal to the first and second axis directions, a length of the cavity in the first axis direction is greater than a height of the cavity in the second axis direction, the first lead frame has a notch between the first heat radiating portion and the first bonding portion, and the second lead frame has a notch between the second heat radiating portion and the second bonding portion, the notches of the first and second lead frames are provided in respective directions corresponding to the second angle associated with the inclined surfaces of the third and fourth areas so that the first heat radiating part is bent at an angle relative to the first bonding portion, and the second heat radiating part is bent at an angle relative to the second bonding portion, the first side surface includes a plurality of flat areas that horizontally extend between the first and second bonding portions, each of the plurality of flat areas is formed of an insulating material of the body, the plurality of flat areas include a first flat area adjacent to the first bonding portion and a second flat area adjacent to the second bonding portion, and a length of the first and second flat areas in the first axis direction is greater than a length of the first and second flat areas in the third axis direction, the first flat area and the second flat area are spaced apart from each other, and the first flat area and the second flat area are spaced apart from the sixth side surface.

14. The light emitting device package of claim 13, further comprising a depression recessed on the sixth side surfaces of the body in a direction corresponding to the first and second lead portions, wherein the first and second areas are overlapped with the depression in the third axis direction.

15. The light emitting device package of claim 13, wherein the first and second angle are acute angles, an angle between the first and third areas is an obtuse angle, and an angle between the second and fourth areas is an obtuse angle.

16. The light emitting device package of claim 13, wherein the first recess has a depth gradually deeper from a straight line extended from the third side surface toward the sixth side surface, and the second recess has a depth gradually deeper from a straight line extended from the fourth side surface toward the sixth side surface.

17. The light emitting device package of claim 16, wherein the third and fourth areas of the third and fourth side surfaces are closer to the sixth side surface than the first and second areas, and a width of the first and second areas in the first axis direction is wider than a width of the third and fourth areas.

18. The light emitting device package of claim 16, wherein the body includes a first body part in which the cavity is provided, and a second body part between the first body part and the sixth side surface, the first side surface includes the plurality of flat areas horizontally extended on the second body part in a direction of the sixth side surface, and a length in a third axis direction horizontally extended to the first side surface of the first and second bonding portions is greater than the length in the first axis direction.

19. The light emitting device package of claim 13, wherein the plurality of flat areas overlap with the first lead portion of the first lead frame provided in the cavity in the second axis direction of the body.

20. The light emitting device package of claim 13, wherein a gap between the first bonding portion and the first flat area is equal to or larger than a gap between the first and second flat areas.

* * * * *